United States Patent
Matsui

(10) Patent No.: US 6,343,046 B1
(45) Date of Patent: Jan. 29, 2002

(54) SEMICONDUCTOR INTEGRATED CIRCUIT DEVICE

(75) Inventor: Yoshinori Matsui, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/525,765

(22) Filed: Mar. 14, 2000

(30) Foreign Application Priority Data

Mar. 15, 1999 (JP) ............................................. 11-069309
Jan. 31, 2000 (JP) ....................................... 2000-023185

(51) Int. Cl.$^7$ ................................................. G11C 8/00
(52) U.S. Cl. .................. 365/230.09; 365/205; 365/190; 711/5
(58) Field of Search ........................... 365/230.09, 205, 365/190; 711/5

(56) References Cited

U.S. PATENT DOCUMENTS

| | | | | |
|---|---|---|---|---|
| 4,943,944 A | * | 7/1990 | Sakui et al. ................. | 365/203 |
| 5,226,009 A | * | 7/1993 | Arimoto ................. | 365/189.04 |
| 5,603,009 A | * | 2/1997 | Konishi et al. ......... | 365/230.03 |
| 6,101,146 A | * | 8/2000 | Maesako et al. ....... | 365/230.03 |
| 6,170,036 B1 | * | 1/2001 | Konishi et al. ......... | 365/230.03 |

FOREIGN PATENT DOCUMENTS

| | | | |
|---|---|---|---|
| JP | 57-20983 | | 2/1982 |
| JP | 60-7690 | | 1/1985 |
| JP | 62-38590 | | 2/1987 |
| JP | 1-146187 | | 6/1989 |
| JP | 4-252486 | | 9/1992 |
| JP | 4-315894 | * | 11/1992 |
| JP | 4-318389 | | 11/1992 |
| JP | 5-2872 | | 1/1993 |
| JP | 5-128857 | * | 5/1993 |
| JP | 5-217374 | * | 8/1993 |
| JP | 9-45081 | * | 2/1997 |

* cited by examiner

*Primary Examiner*—Amir Zarabian
*Assistant Examiner*—VanThu Nguyen
(74) *Attorney, Agent, or Firm*—Young & Thompson

(57) ABSTRACT

The semiconductor integrated circuit device of the present invention is provided with a main memory unit and an auxiliary memory unit which functions as a cache memory, and has a structure which permits bidirectional data transfer via data transfer bus lines which are provided between the main memory unit and the auxiliary memory unit; a data transfer bus line precharge power source circuit is provided which supplies to data transfer bus line, when data is not being transferred, a voltage having a level which is lower than the power source voltage supplied to main memory unit. By means of the present invention, it is possible to efficiently conduct data transfer between a main memory unit and an auxiliary memory unit having different operational voltages, and moreover, it is possible to effectively suppress interior noise which is generated.

6 Claims, 19 Drawing Sheets

SEMICONDUCTOR INTEGRATED CIRCUIT DEVICE

BACKGROUND OF THE INVENTION

1. Field of the Invention

The present invention relates to a semiconductor integrated circuit device. In particular, it relates to a semiconductor integrated circuit device wherein a main memory unit and an auxiliary memory unit are formed on the same semiconductor substrate and a data transfer circuit is provided between the main memory unit and the auxiliary memory unit.

2. Description of the Related Art

Large-capacity semiconductor devices which are comparatively slow and inexpensive are commonly employed as the main memory devices used in computer systems; common DRAMs, which meet these requirements, are widely employed in this way.

Furthermore, attempts have recently been made in computer systems to increase the speed of the DRAMs which comprise the main memory units in response to an increase in speed of the system (in particular, an increase in speed of the MPU); however, this is insufficient with respect to the increase in speed of the MPU, and most systems incorporate a high-speed memory between the MPU and the main memory unit as an auxiliary memory unit. These auxiliary memory units are commonly termed cache memories, and high speed SRAMs or ECLRAMs or the like are commonly employed as such cache memories.

Actually installed cache memories include those which are provided outside the MPU and those which are installed within the MPU; recently, semiconductor memory devices have attracted attention in which the DRAM which comprises the main memory unit and the cache memory are installed on the same semiconductor substrate. Conventional examples thereof include those disclosed in, for example, Japanese Patent Application, First Publication No. SHO 57-20983, Japanese Patent Application, First Publication No. SHO 60-7690, Japanese Patent Application, first publication No. SHO 62-38590, and Japanese Patent Application, First Publication No. HEI 1-146187. These preceding technology semiconductor memory devices have both a DRAM and cache memory installed, and have come to be termed by some cache DRAMs. Furthermore, they are also termed CDRAM. These have a structure in which data may be transferred in both directions between the SRAM which functions as the cache memory and the DRAM which functions as the main memory unit.

This preceding technology had problems, such as a delay in the data transfer operation during cache mishits, so that improved technology was proposed. The improved conventional technology was that described below. For example, in the technology disclosed in Japanese Patent Application, First Publication No. HEI 4-252486, Japanese Patent Application, First Publication No. HEI 4-318389, and Japanese Patent Application, First Publication No. HEI 5-2872, the characteristic feature was that a latch or a register function was provided in the bidirectional data transfer circuit which served to conduct data transfer between the DRAM and SRAM unit; this was capable of simultaneously conducting data transfer from the SRAM to the DRAM unit and from the DRAM unit to the SRAM unit, and enabled an increase in data transfer (copy back) speed during cache mishits.

This technology will be explained using as an example that disclosed in Japanese Patent Application, First Publication No. HEI 4-318389.

FIG. 17 shows, in schematic form, an example of the structure of an CDRAM memory array unit. In FIG. 17, the semiconductor memory devices contains a DRAM array 9201 which contains dynamic type memory cells, and an SRAM array 9202 which contains static type memory cells, and a bidirectional transfer gate circuit 9203, which serves to conduct data transfer between the DRAM array 9201 and the SRAM array 9202. Furthermore, each of the DRAM array 9201 and the SRAM array 9202 are provided with a corresponding row decoder and column decoder. The addresses assigned to the row decoder and column decoder of the DRAM and the row decoder and column decoder of the SRAM are independent of one another, and the structure is such that this assignment is conducted via differing address pin terminals. FIGS. 18 and 19 show the details of the structure of the bidirectional transfer gate circuit 9203. By means of the structure depicted, the data transfer from SBL to the GIO and the data transfer from the GIO to the SBL employ differing data transfer paths, and as a result of the function of the latch 9305 and amplifier 9306, it is possible to execute these data transfers in an overlapping fashion.

In semiconductor integrated devices, among functions which relate to the entirety of the package, a decrease in power consumption and an increase in operational speed are commonly desired. In general, when the operating voltage is increased, it is possible to achieve an increase in operating speed; however, as a result, the power consumption tends to rise. When on the other hand, the operational voltage is set at a low level in order to achieve a reduction in power consumption, this entails a sacrifice of operating speed.

In CDRAMs employing the conventional technology described above, in order to achieve a reduction in power consumption, the operating voltage of the DRAM which serves as the main memory unit is set at a low level, while in contrast, the operating voltage of the SRAM which functions as a cache memory and forms the auxiliary memory unit is set at a high level to accommodate the requirement of an increase in speed.

The bidirectional transfer gate circuit depicted in FIG. 17 is extremely important in order to conduct data transfer between the main memory unit and the auxiliary memory unit, which have differing operational power levels. The reason for this is that, in semiconductor memory circuit devices in which a cache memory such as that described above is installed, because the operating voltage of the main memory unit is low, there are cases in which a plurality of processes must be executed simultaneously, such as when data transfer is conducted in an overlapping manner as in the case of the CDRAM described above, and in such cases, the internal noise generated as a consequence of the operation of the circuitry reaches a high level and this tends to result in operational errors within the circuitry. In particular, in cases in which an DRAM which handles extremely weak data signals is employed as the chief memory unit, it is necessary to effectively suppress the internal noise generated. In this situation, problems are caused even when data transfer is conducted between the main memory unit and the auxiliary memory unit.

Furthermore, in recent years, an increase in operational speed has been required of semiconductor integrated circuit devices, as described above; however, if data transfer can not be efficiently conducted between a main memory unit and an auxiliary memory unit which have different operational voltages, it is impossible to obtain an increase in operating speed.

SUMMARY OF THE INVENTION

The present invention was created in light of the above circumstances; it has as an object thereof to provide a semiconductor integrated circuit device which is capable of efficiently conducting data transfer between a main memory unit and an auxiliary memory unit which operate at different operational voltages, and moreover, is capable of operating in a stable manner while effectively suppressing internal noise which is generated.

In order to solve the problem described above, a first semiconductor integrated circuit device of the present invention is provided with a main memory unit and an auxiliary memory unit which functions as a cache memory and has a structure in which bidirectional data transfer is possible via a data transfer bus line which is provided between the main memory unit and the auxiliary memory unit, and furthermore, this device is provided with a power source mechanism which supplies to the data transfer bus line, when data is not being transferred, a voltage which is lower than the power source voltage supplied to the main memory unit.

The device of the present invention may be provided with a sense amplifier circuit which is provided in the main memory unit, and a sense amplifier unit control circuit for controlling this sense amplifier circuit; the sense amplifier unit control circuit supplies, to the connecting circuit which serves to connect the sense amplifier circuit and the data transfer bus line, a main memory unit power source level, when data is transferred from the main memory unit to the auxiliary memory unit, and a main memory unit increased voltage power source level, which represents an increase in the main memory unit power source level, when data is transferred from the auxiliary memory unit to the main memory unit.

Furthermore, the device of the present invention may be provided with a plurality of memory cells provided in the auxiliary memory unit, and an auxiliary memory unit control circuit for controlling the auxiliary memory unit; this auxiliary memory unit control circuit supplies, to the connecting circuit which connects the memory cells and the data transfer bus line, a main memory unit increased voltage power source level, which represents an increase in the main memory unit power source level, when data transferred from the main memory unit are to be incorporated, and supplies the main memory unit power source level when data are to be transferred from the memory cells to the main memory unit.

Furthermore, in the device of the present invention, when data transferred from the auxiliary memory unit are to be incorporated, it is preferable that the sense amplifier unit control circuit place the transistors provided within the sense amplifier circuit in a non-conductive state prior to incorporation.

Furthermore, in the device of the present invention, when data transferred from the main memory unit are to incorporated, it is preferable that the auxiliary memory unit control circuit place the transistors provided within the memory cells in a non-conducting state prior to incorporation.

A second semiconductor integrated circuit device of the present invention is provided with a main memory unit and an auxiliary memory unit, and has a structure such that bidirectional data transfer is possible via data transfer bus lines which are provided between the main memory unit and the auxiliary memory unit, and is further provided with:

sense amplifier circuits which are provided in the main memory unit, a sense amplifier unit control circuit for controlling the sense amplifier circuits, and a switch mechanism for electrically connecting the sense amplifier circuits and the main memory memory cells within the main memory unit;

after the data transferred from the main memory unit to the auxiliary memory unit have been incorporated into the sense amplifier circuits, the sense amplifier unit control circuit controls the switch mechanism and electrically disconnects the sense amplifier circuits and the main memory unit memory cells, and in this disconnected state, the data are transferred from the main memory unit to the auxiliary memory unit.

The sense amplifier unit control circuit may, in parallel with the amplification of the data incorporated into the sense amplifier circuits, control the switch mechanism and electrically disconnect the sense amplifier circuits and the main memory unit memory cells, and may transfer the data when a transfer initiation command for initiating data transfer from the main memory unit to the auxiliary memory unit is inputted in the state in which the sense amplifier circuits and the main memory unit memory cells are electrically disconnected.

Furthermore, the sense amplifier unit control circuit may conduct the amplification of the data incorporated into the sense amplifier circuits and, when a transfer initiation command for initiating data transfer from the main memory unit to the auxiliary memory unit has been inputted, electrically disconnect the sense amplifier circuits from the main memory unit memory cells, and may transfer the data in the state in which the sense amplifier circuits are electrically disconnected from the main memory unit memory cells.

Furthermore, the operation initiation command, which activates the main memory unit, and the transfer operation initiation command, which initiates data transfer from the main memory unit to the auxiliary memory unit, may be inputted at the same timing.

Furthermore, the sense amplifier unit control circuit may control the switch mechanism at the termination of transfer and electrically connect the sense amplifier circuits with the main memory unit memory cells.

The auxiliary memory unit may be divided into a plurality of auxiliary memory unit memory cell rows, and when transfer to the plurality of auxiliary memory unit memory cell rows is terminated, the sense amplifier unit control circuit may control the switch mechanism and electrically connect the sense amplifier circuits with the main memory unit memory cells.

A third semiconductor integrated circuit device of the present invention is provided with a main memory unit and an auxiliary memory unit and has a structure such that bidirectional data transfer is possible via data transfer bus lines which are provided between the main memory unit and the auxiliary memory unit, and this device is further provided with:

sense amplifier circuits which are provided in the main memory unit, and a sense amplifier unit control circuit for controlling the sense amplifier circuit; wherein the sense amplifier circuits have a segmented structure in which a plurality are provided with respect to each data transfer bus line, and the sense amplifier unit control circuit electrically connects one sense amplifier circuit to each data transfer bus line, and, prior to conducting data transfer from the auxiliary memory unit to the main memory unit, carries out an amplification operation with respect to those sense amplifier circuits which are not connected to data transfer bus lines.

The sense amplifier circuits are provided with balance precharge circuits, and the sense amplifier unit control circuit may have a mechanism for controlling the balance precharge circuit of each segment.

Furthermore, the sense amplifier circuits may be provided with switch mechanisms for electrically connecting the sense amplifier circuits with the main memory unit memory cells in the main memory unit, and the sense amplifier unit control circuit may, when data transfer is conducted from the auxiliary memory unit to the main memory unit, electrically disconnect the sense amplifier circuits from the main memory unit memory cells.

In accordance with the present invention, when data is not transferred, a voltage having a level lower than the power source voltage supplied to the main memory unit is supplied to the data transfer bus lines, and thereby, it is possible to conduct stable operations while effectively suppressing the interior noise generated.

Furthermore, during the transfer of data from the main memory unit to the auxiliary memory unit or from the auxiliary memory unit to the main memory unit, the voltage provided to the connecting circuit connecting the sense amplifier circuits and the data transfer bus lines and to the connecting circuits connecting the memory cells and the data transfer bus lines are varied, so that it is possible to efficiently conduct data transfer between a main memory unit and an auxiliary memory unit which operate at differing operational voltages.

Furthermore, by adjusting the timing of the electrical disconnection of the sense amplifier circuits and the main memory unit memory cells, and the amplification operation of the data incorporated into the sense amplifier circuits, and by making the input timing of the operation initiation command and the transfer operation initiation command identical, application is possible even in cases in which the operational frequency is high.

DETAILED DESCRIPTION OF THE INVENTION

Hereinbelow, a semiconductor integrated circuit device in accordance with embodiments of the present invention will be explained in detail with reference to the figures.

[First Embodiment]

(1) Fundamental Structure

Hereinbelow, the fundamental structure of a first embodiment of the present invention will be explained.

The semiconductor integrated circuit device of the present invention contains a semiconductor memory device and a control device for this semiconductor memory device. The semiconductor memory device has a main memory unit and an auxiliary memory unit, and has a structure such that bidirectional data transfer is possible between the main memory unit and the auxiliary memory unit. Furthermore, the auxiliary memory unit comprises a plurality of memory cell groups, and the various memory cell groups of the auxiliary memory unit may function as independent caches. Furthermore, in the semiconductor memory device of the present invention, the number of control terminals or address terminals may be the same number as is necessary for controlling the main memory unit.

Hereinbelow, the explanation will center on an embodiment relating to a semiconductor memory device having a 64 Mbit DRAM array as the main memory unit, and having, as the auxiliary memory unit, a 16 Kbit SRAM array×8 bits, thus having a two-bank structure with a synchronous interface. However, the present invention is in no way limited to such a structure.

(2) Block Diagram

Figure 1:
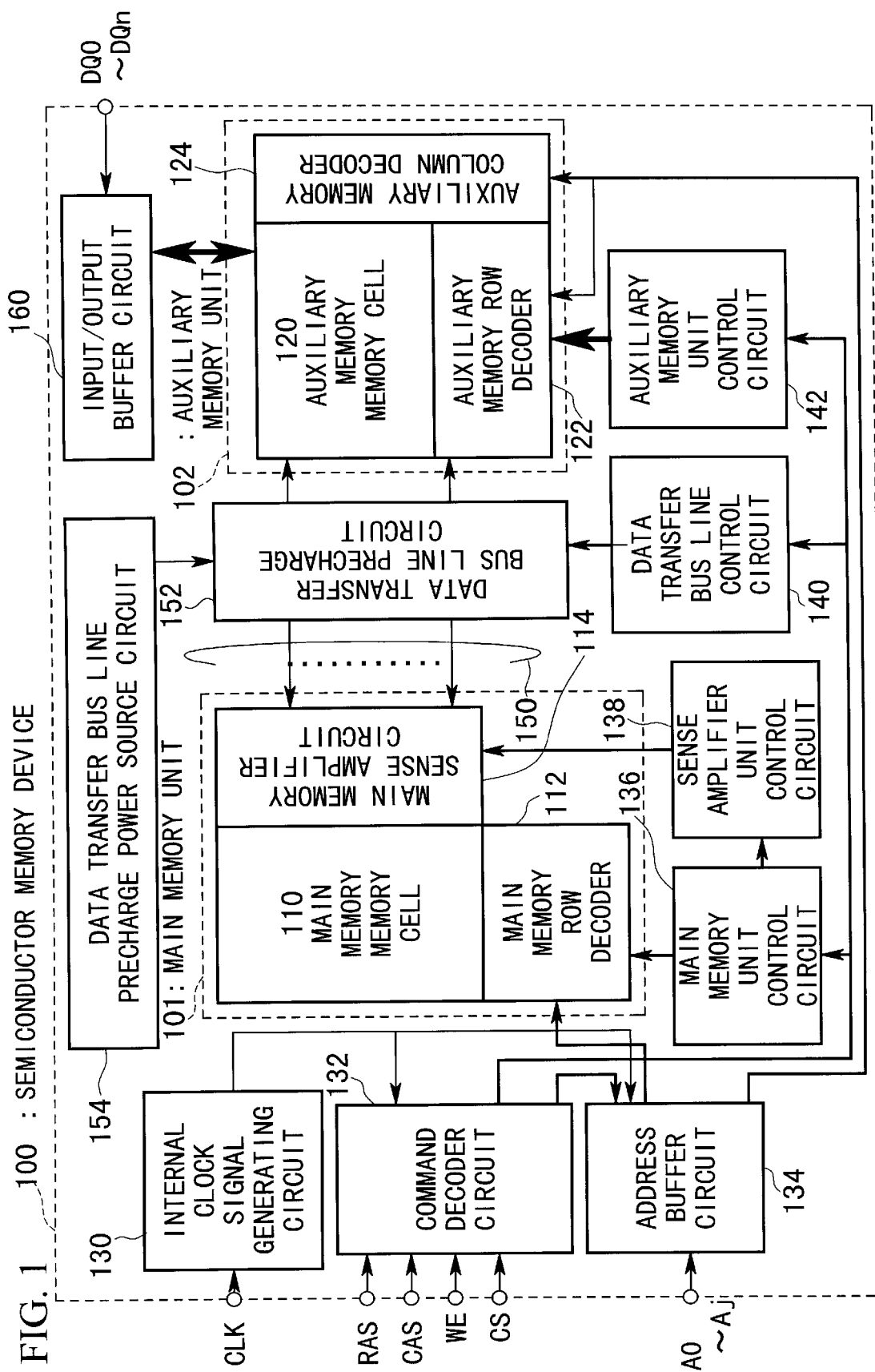
FIG. 1 is a block diagram showing a schematic view of the entirety of the structure of a semiconductor memory device in accordance with a first embodiment of the present invention.

FIG. 1 is a block diagram showing in schematic form the entire structure of a semiconductor memory device in accordance with a first embodiment of the present invention.

In FIG. 1, semiconductor memory device 100 is provided with main memory unit 101 and an auxiliary memory unit 102.

Main memory unit 101 is provided with main memory unit memory cells 110, which are provided with a plurality of dynamic type memory cells arranged in the form of a matrix comprising rows and columns, a main memory row decoder 112, which receives main memory unit address signals outputted from an address buffer circuit 134 discussed hereinbelow and control signals outputted from main memory unit control circuit 136, and which selects the appropriate row of main memory unit memory cell 110, and a sense amplifier 114, which detects the data stored in the main memory unit memory cells selected and amplifies these data. Furthermore, although not depicted in the figure, main memory unit memory cell 110 is divided into a plurality of blocks, termed banks, divided, for example, into two banks A and B, and bank A or bank B is selected on the basis of a control signal outputted from main memory unit control circuit 136.

Auxiliary memory unit 102 is provided with auxiliary memory unit memory cells 120, which are provided with a plurality of static type memory cells arranged in a matrix shape comprising rows and columns, auxiliary memory row decoder 122, which receives an auxiliary memory row selection signal outputted from an auxiliary memory unit control circuit 142 discussed hereinbelow, and an auxiliary memory unit address signal outputted from an address buffer circuit 134, and selects a divided auxiliary memory cell group (in the present embodiment, the cell groups are divided by row), and an auxiliary memory column decoder 124, which generates an auxiliary memory column selection signal from the auxiliary memory unit address signal outputted by address buffer circuit 134 and conducts column selection by means of this auxiliary memory column selection signal.

Reference 130 indicates an internal clock signal generating circuit which generates an internal clock employed in semiconductor memory device 100 on the basis of a clock CLK supplied externally; the internal clock generated is outputted to command decoder circuit 132 and address buffer circuit 134.

Based on the inputted chip select signal CS and the externally inputted RES signal, CAS signal and WE signal, command decoder circuit 132 conducts decoding to the control signals necessary within semiconductor memory device 100, and then outputs the decoded control signals to address buffer circuit 134, as well as to the main memory unit control circuit 136, data transfer bus line control circuit 140, and auxiliary memory unit control circuit 142 discussed hereinbelow.

Based on the inputted address signals A0–Aj (where j is an integer having a value of 0 or more) and the control signal outputted from the command decoder circuit 132, address buffer circuit 134 generates a main memory unit address signal which designates addresses in main memory unit 101, and an auxiliary memory unit address signal which designates addresses in auxiliary memory unit 102.

Main memory unit control circuit 136 outputs a control signal for selecting the row to main memory row decoder 112 based on the control signal outputted by command decoder circuit 132, and also outputs a control signal for selecting the bank described above. Furthermore, it outputs a control signal for controlling the operation of sense amplifier unit 138.

The sense amplifier control circuit 138 controls the main memory sense amplifier circuit 114 based on the control signal outputted by main memory unit control circuit 136.

Data transfer bus line control circuit 140 controls the operation of a data transfer bus line precharge circuit 152 which is provided on the data transfer bus lines 150 which connect the main memory sense amplifier circuits 114 provided within main memory unit 101 and the auxiliary memory cells 120. Power is supplied to the data transfer bus line precharge circuit 152 from the data transfer bus line precharge power source circuit 154.

Auxiliary memory unit control circuit 142 receives a control signal outputted by command decoder circuit 132, and generates a row selection signal for auxiliary memory memory cells 120, controlling the operation of auxiliary memory memory cells 120, and controls the data transmission and reception conducted with the input/output buffer 160 which is provided so as to control the external data sending and reception.

In this embodiment, an example was explained in which DRAM was employed as the main memory unit 101, and SRAM was employed for the auxiliary memory unit 102; however the present invention is not necessarily so limited. In addition to DRAM, SRAM, mask ROM, PROM, EPROM, EEPROM, flash EEPROM, ferroelectric memory, or other memory may be employed as the main memory unit. It is desirable that the memory making up the main memory unit be structured so as to effectively employ the type or special functions thereof. For example, with respect to the case in which DRAM is employed as the main memory unit, common DRAM, EDODRAM, synchronous DRAM, synchronous GRAM, burst EDODRAM, DDR synchronous DRAM, DDR synchronous GRAM, SLDRAM, Rambus DRAM or the like, may be appropriately employed. Furthermore, other memory may be employed for the auxiliary memory unit in so far as it is random access memory which is capable of higher speed access than the memory which is employed for the main memory unit. When flash EEPROM is employed for the main memory unit, it is preferable that the memory capacity of the auxiliary memory unit be one half or more the capacity of one erasing sector unit of the flash EEPROM.

(3) Model Diagram

Next, the data transfer between the main memory memory cells 110 and the auxiliary memory memory cells 120 will be explained.

Figure 2:
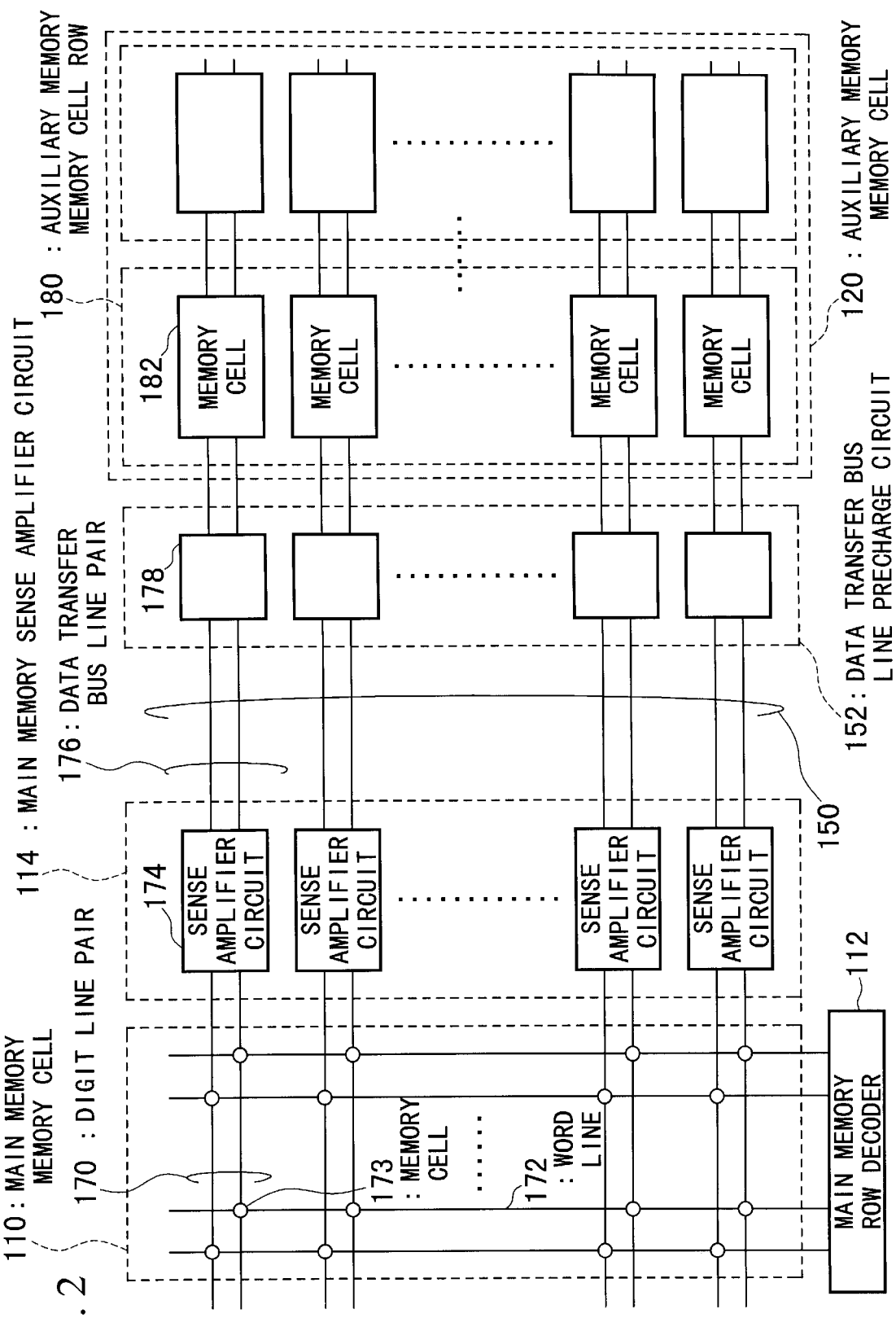
FIG. 2 is a diagram showing in simplified form the connection relationships between the main memory memory cells 110 and the auxiliary memory memory cells 120 shown in FIG. 1 in the first embodiment.

FIG. 2 shows, in simplified form, the connection relationships between the main memory memory cells 110 and the auxiliary memory memory cells 120 in FIG. 1 in accordance with the first embodiment. FIG. 2 serves to facilitate the understanding of the present embodiment, and a one to one correspondence is depicted between the sense amplifier circuits of main memory unit 101 and the memory cell columns of auxiliary memory unit 102; however, the present invention is not limited to the structure depicted in FIG. 2, so that for example, a structure is also possible in which a single auxiliary memory unit memory cell column corresponds to two adjacent sense amplifier circuits of main memory unit 101 (plural segments).

In FIG. 2, reference 110 indicates the main memory memory cell; a plurality of digit line pairs 170 and word lines 172, which are connected to the main memory row decoder, are disposed in an intersecting manner, and memory cells 173 are formed at the junction points thereof. The digit line pairs 170 are connected to the sense amplifier circuits 174 within the main memory sense amplifier circuit 114. The number of sense amplifier circuits 174 which are provided is equal to the number of digit line pairs 170 within main memory memory cell 110. As is shown in FIG. 1, the main memory sense amplifier circuits 114 and the auxiliary memory memory cells 120 are connected by means of data transfer bus lines 150; however, the number of data transfer bus line pairs 176 provided in correspondence to the sense amplifier circuits 174 in this data transfer bus line 150 is equal to the number of sense amplifier circuits 174.

Within data transfer bus line precharge circuit 152, precharge circuits 178 are provided in correspondence to each of the data transfer bus line pairs 176. The number of these precharge circuits 178 provided is equal to the number of data transfer bus line pairs 176.

As shown in FIG. 2, auxiliary memory memory cell 120 comprises a plurality of auxiliary memory memory cell rows 180, and in each of the auxiliary memory memory cell rows 180, memory cells 182 are provided in correspondence to the data transfer bus line pairs 176.

As described above, FIG. 2 serves to simplify the understanding of the present embodiment, and it should be borne in mind that this diagram is simplified.

Next, the internal structure of the data transfer bus line precharge power source circuit 154, data transfer bus line precharge circuit 152, main memory sense amplifier circuit 114, and auxiliary memory memory cell row 180 which are depicted in FIGS. 1 and 2 will be explained in detail.

[Data Transfer Bus Line Precharge Circuit 152]

Next, the interior structure of the data transfer bus line precharge circuit 152 will be explained.

Figure 3:
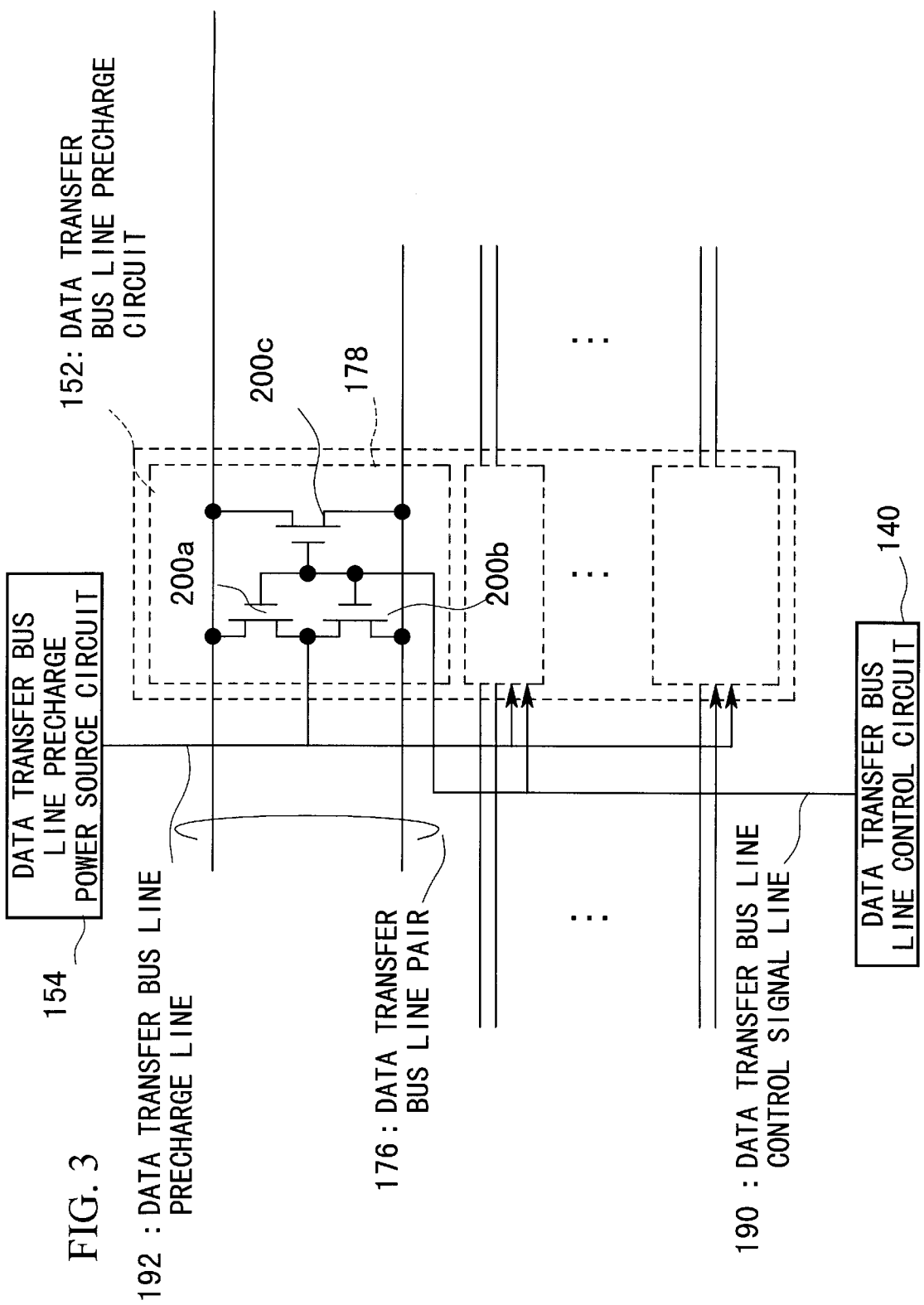
FIG. 3 shows the internal structure of the data transfer bus line precharge circuit 152; those parts which are also shown in FIGS. 1 and 2 are given identical reference numbers.

FIG. 3 shows the interior structure of the data transfer bus line precharge circuit 152; those parts which are depicted in FIGS. 1 and 2 are given identical reference numbers.

As shown in FIG. 3, data transfer bus line precharge circuit 152 is provided with a number of precharge circuits 178 equal to the number of data transfer bus line pairs 176. In precharge circuit 178, a N channel MOS transistor (hereinbelow referred to as a NMOS transistor) 200a is connected in one direction to the data transfer bus line pair 176, while NMOS transistor 200a is connected to a NMOS transistor 200b, NMOS transistor 200b is connected at the other end to a data transfer bus line pair 176, and furthermore, an NMOS transistor 200c is connected between the data transfer bus line pair 176, and the gates of NMOS 200a, 200b, and 200c are connected to one another.

Furthermore, a data transfer bus line precharge line 192 which is connected to the data transfer bus line precharge power source circuit 154 is connected to the connection point of NMOS transistors 200a and 200b. Furthermore, a data transfer bus control signal line 190, which is connected to the data transfer bus line control circuit 140, is connected to the connection point of the gates NMOS transistors 200a, 200b, and 200c.

[Data Transfer Bus Line Precharge Power Source Circuit 154]

Next, the internal structure of the data transfer bus line precharge power source circuit 154 will be explained.

Figure 4:
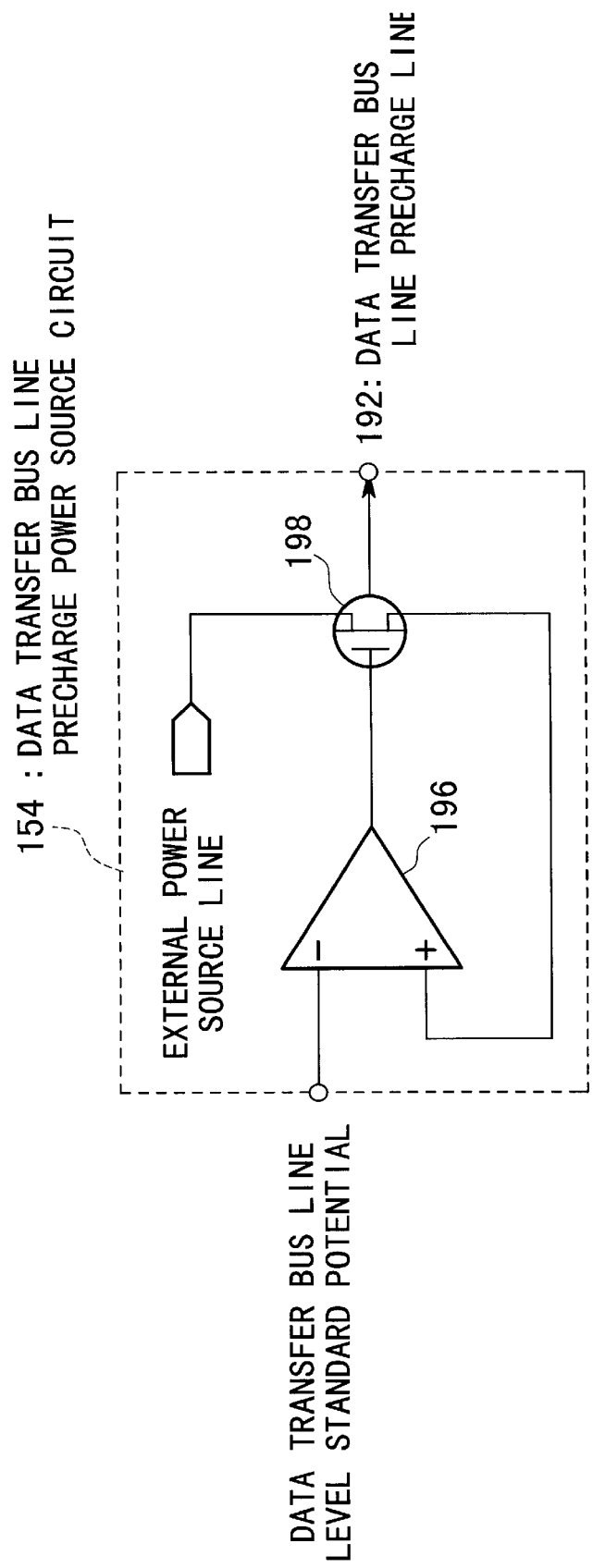
FIG. 4 shows the internal structure of data transfer bus line precharge power source circuit 154.

FIG. 4 shows the interior structure of the data transfer bus line precharge power source circuit 154.

As is shown in FIG. 4, the data transfer bus line precharge power source circuit 154 comprises an operator amplifier and a P channel type MOS transistor (hereinbelow referred to as an PMOS transistor) 198.

A data transfer bus line level standard potential, which serves as a standard voltage for setting the voltage of data transfer bus line precharge line 192, is inputted into the negative input terminal of operator amplifier 196, and the gate of PMOS transistor 198 is connected to the output terminal of operator amplifier 196. Furthermore, an external power source line is connected to the PMOS transistor 198, and the other terminal thereof is connected to the positive input terminal of operator amplifier 196, and the data transfer bus line precharge line 192 is also connected.

[Main Memory Sense Amplifier Circuit 114]

Figure 5:
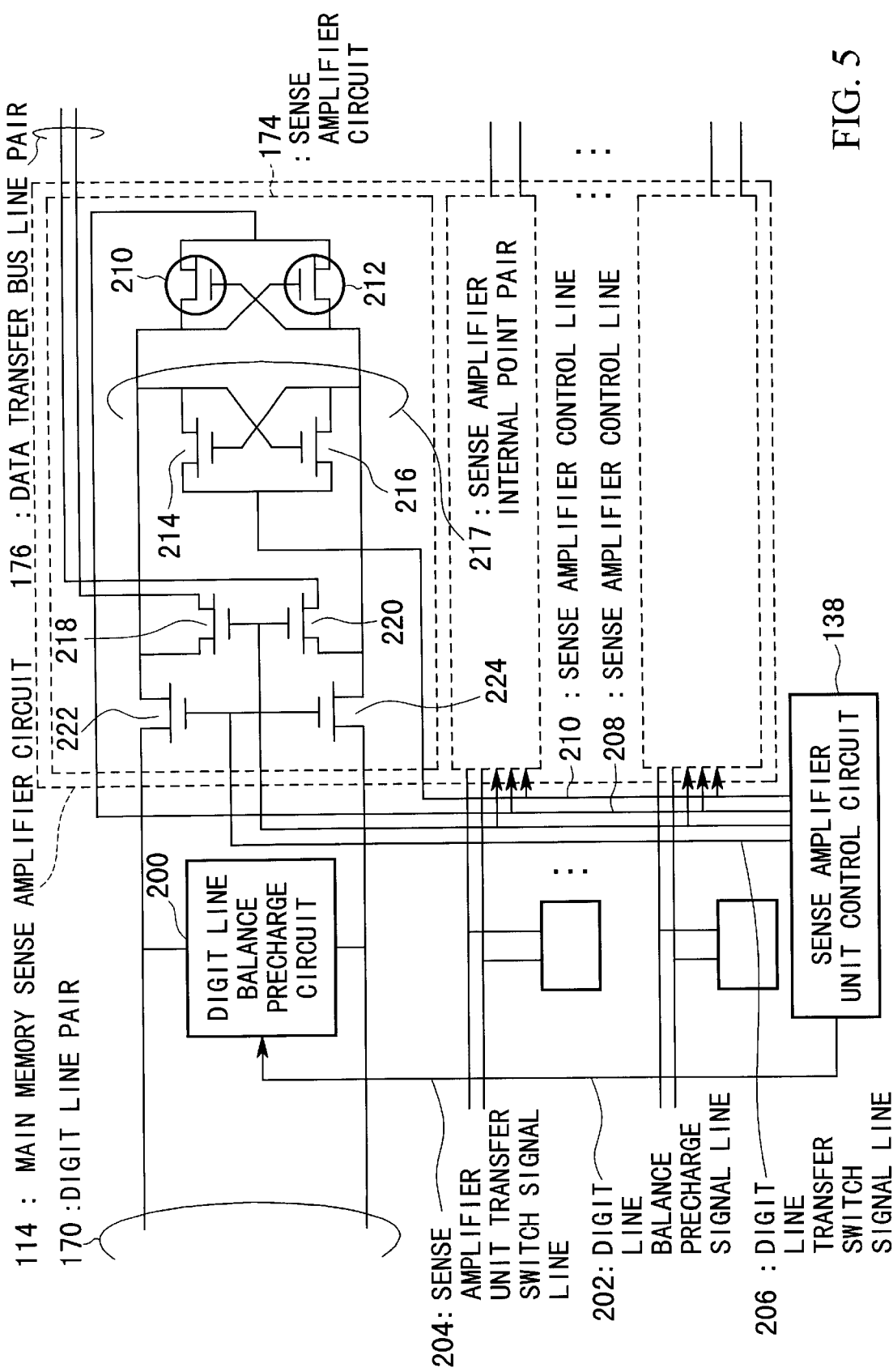
FIG. 5 shows the structure of a main memory sense amplifier circuit 114.

FIG. 5 shows the structure of the main memory sense amplifier circuit 114; those parts which are the same as the parts depicted in FIGS. 1 and 2 are given identical reference numbers.

As shown in FIG. 5, a digit line balance precharge circuit 200 is provided at each digit line pair 170. This digit line balance precharge circuit 200 and the sense amplifier unit control circuit 138 are connected by a digit line balance precharge signal line 202.

Furthermore, flip flop circuits are provided in each sense amplifier circuit 174. These flip flop circuits are constructed using PMOS transistors 210 and 212 and NMOS transistors 214 and 216.

Furthermore, the connecting circuit which connects the digit line pair 170 and the data transfer bus line pair 176 is constructed using NMOS transistors 218 and 220. The NMOS transistors 222 and 224 which are provided in each of the digit line pairs 170 are switch transistors which are provided in order to disconnect the sense amplifier circuit 174 from the digit line pair.

The digit line balance precharge signal line 202 is connected to the sense amplifier unit control circuit 138, and in addition, the digit line transfer switch signal line 206, a sense amplifier unit transfer switch signal line 204, a sense amplifier control line 208 and a sense amplifier control line 210 are also connected thereto.

The digit line balance precharge signal line 202 transmits a control signal, which controls the precharge level in the digit line balance precharge circuit 200, from the sense amplifier unit control circuit 138 to the digit line balance precharge circuit 200; furthermore, digit line transfer switch signal line 206 serves to transmit a control signal, which controls the disconnection of sense amplifier circuit 174 from the digit line pair or the connection to the digit line pair, to the NMOS transistors 222 and 224.

Furthermore, the sense amplifier unit transfer switch signal line 204 transmits a control signal, which controls whether or not a signal which is incorporated into sense amplifier circuit 174 and is sense-amplified by sense amplifier internal point pair 217 is to be outputted to data transfer bus line pair 176, and whether or not a signal transmitted via data transfer bus line pair 176 is to be incorporated into amplifier circuit 174.

The semiconductor integrated circuit device in the present embodiment conducts data transfer in units of 1024 bits per each data transfer. In this case, the level of the signal is suppressed in order to achieve a low power consumption, and the level is 10% or less than that of the power source voltage supplied to the main memory unit 101.

In this way, because the signal level is low, when the signal is incorporated into, for example, the sense amplifier circuit 174 shown in FIG. 2, when the initial potential of the data bus transfer bus line is set to the power source voltage of main memory unit 101, the level of the sense amplifier unit transfer switch signal, which is supplied from the sense amplifier unit control circuit to the connecting circuit formed by NMOS transistors 218 and 220 via sense amplifier unit transfer switch signal line 204, is necessarily set to a higher voltage. Accordingly, in order to ameliorate the voltage rise in potential, the precharge level of the data transfer bus line pair 176 when transfer is not being conducted is set to an intermediate potential lower than the power source voltage of the main memory unit. A value of, for example, half of the power source voltage of the main memory unit may be employed as this intermediate potential.

Furthermore, this intermediate potential is generated by applying the data transfer bus line level standard potential to the data transfer bus line precharge power source circuit 154 shown in FIG. 4, and the intermediate potential is generated from an independent power source, so that fluctuating noise in the power source potential resulting from the operation of other circuit elements does not have an effect on the data transfer bus line pair 176.

Furthermore, sense amplifier control line 208 transmits a control signal for controlling the amplification ratio of the flip flop comprising PMOS transistors 210 and 212, and sense amplifier control line 210 transmits a control signal for controlling the amplification ratio of the flip flop comprising NMOS transistors 214 and 216.

Next, a part of the internal structure of the sense amplifier unit control circuit 138 will be explained.

Figure 6:
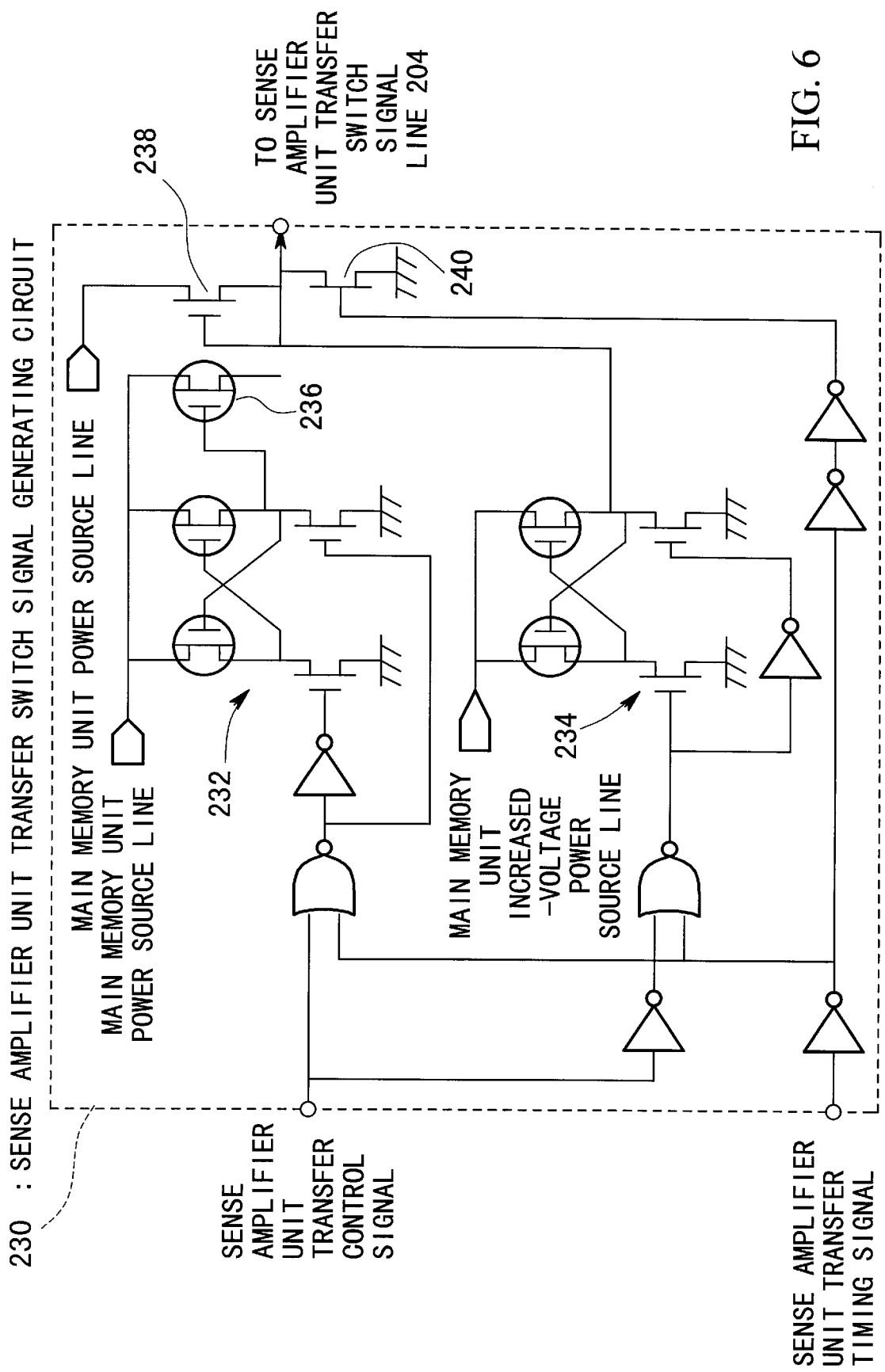
FIG. 6 shows the structure of a sense amplifier unit transfer switch signal generating circuit 230 which is provided within sense amplifier unit control circuit 138.

FIG. 6 shows the structure of the sense amplifier unit transfer switch signal generating circuit 230 provided within the sense amplifier unit control circuit 138. This sense amplifier unit transfer switch signal generating circuit 230 generates a control signal which controls whether or not a signal incorporated in the sense amplifier circuit 174 and sense amplified by sense amplifier internal point pair 217 is outputted to data transfer bus line pair 176, and controls whether or not a signal transmitted via data transfer bus line pair 176 is incorporated into sense amplifier circuit 174, and also controls the power source supplied to the sense amplifier circuit 174.

Even if the initial potential of the data transfer bus line pair 176 is set to an intermediate potential as described above, when a signal is incorporated into sense amplifier circuit 174, it is necessary that the sense amplifier unit transfer switch signal which is supplied from the sense amplifier unit control circuit 138 shown in FIG. 5 to a connecting circuit comprising NMOS transistors 218 and 220 via sense amplifier unit transfer switch signal line 204 be the main memory unit increased voltage power source, representing an increase in voltage with respect to the power source voltage of the main memory unit 101.

On the other hand, when data is transferred from sense amplifier circuit 174 to memory cell 182, when the main memory unit increased voltage power source is applied as the sense amplifier unit transfer switch signal, the data transfer bus line pair 176 is set from the high side junction level within sense amplifier circuit 174, so that this is subtracted from the level of data transfer bus line pair 176 and the high side junction level within sense amplifier circuit 174 decreases and the data transfer ability from sense amplifier circuit 274 to data transfer bus line pair 176 decreases.

In order to solve the problem described above, when a signal is incorporated into the sense amplifier circuit 174, or when data is transferred from the sense amplifier circuit 274 to the memory cell 182, the sense amplifier unit transfer switch signal generating circuit 230 shown in FIG. 6 is the circuit which controls whether the sense amplifier unit transfer switch which is supplied from sense amplifier unit control circuit 138 to the connecting circuit comprising NMOS transistors 218 and 220 via sense amplifier unit transfer switch signal line 204 is set to the main memory unit power source which is employed as the power source in the main memory unit 101 or is set to the main memory unit increased voltage power source.

Referring to FIG. 6, a sense amplifier unit transfer control signal and a sense amplifier unit transfer timing signal are supplied to the sense amplifier unit transfer switch signal generating circuit 230. The sense amplifier unit transfer control signal is a signal which controls whether the sense amplifier unit transfer switch signal is set to the main memory unit power source or to the main memory unit increased voltage power source, while the sense amplifier unit transfer timing signal is a signal which controls the timing of transfer. These signals are generated within the sense amplifier unit control circuit 138.

As a result of the sense amplifier unit transfer control signal, either the output of flip flop 232 or the output of flip flop 234 is set to a high level. A PMOS transistor 236 to which the main memory unit increased voltage power source is supplied is connected to the output of flip flop 232, while a NMOS transistor 238 to which the main memory unit power source is supplied is connected to the output of flip flop 234, and the output of PMOS transistor 236 and the output of NMOS transistor 238 is connected to sense amplifier unit transfer switch signal line 204.

Furthermore, the sense amplifier unit transfer timing signal is supplied to the base of NMOS transistor 240 via an inverter and a buffer circuit. This NMOS transistor 240 is connected to the sense amplifier unit transfer switch signal line 204 and is also grounded. In other words, based on the sense amplifier unit transfer timing signal, the NMOS transistor 240 activates and deactivates the sense amplifier unit transfer switch signal line 204. When the sense amplifier unit transfer switch signal line 204 is deactivated, the connecting circuit formed by NMOS transistors 218 and 220 is disconnected, so that data transfer does not occur.

[Auxiliary Memory Memory Cell Row 180]

Figure 7:
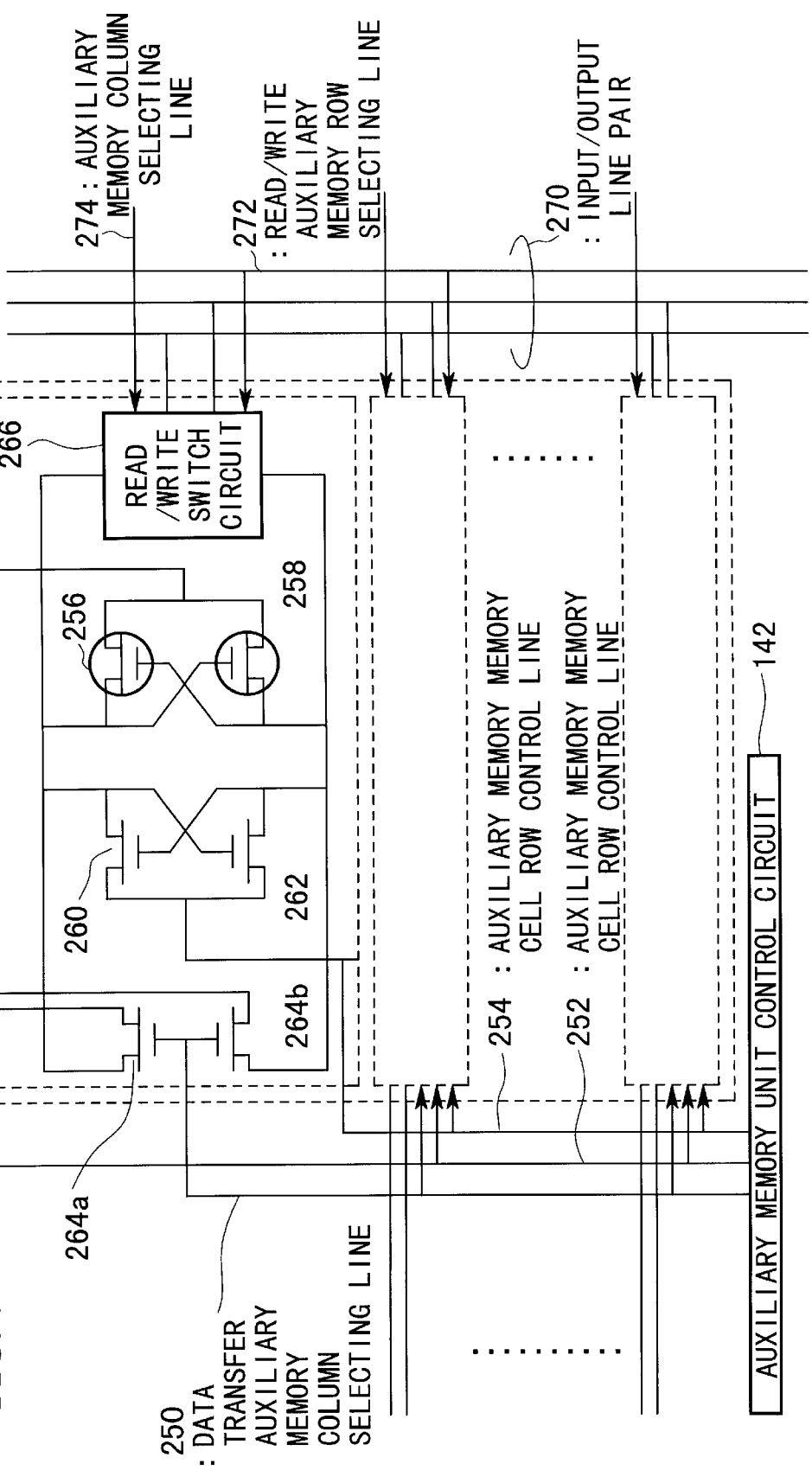
FIG. 7 shows the internal structure of an auxiliary memory memory cell row 180.

FIG. 7 shows the internal structure of the auxiliary memory memory cell row 180; those parts which are depicted in FIGS. 1 and 2 are given identical reference numbers.

As shown in FIG. 7, auxiliary memory memory cell row 180 has a plurality of memory cells 182. Flip flop circuits are provided for each the memory cells 182. These flip flop circuits comprise PMOS transistors 256 and 258 and NMOS transistors 260 and 262.

Furthermore, the connecting circuit which conducts the incorporation of a signal from data transfer bus line pair 176 and the sending of a signal to data transfer bus line pair 176 comprises NMOS transistors 264a and 264b. Furthermore, a read/write switch circuit 266 is connected in parallel to the flip flop circuit and the connecting circuit. This read/write switch circuit 266 serves to output data stored in the flip flop circuit to input/output line pair 270 and to incorporate data appearing in data input/output line pair 270 into the flip flop circuit. An auxiliary memory column selecting line 274 and a read/write auxiliary memory row selecting line 272 are connected to this read/write switch circuit 266, and based on control signals which are inputted via these lines, data input and output control is conducted.

Each memory cell 182 is connected to auxiliary memory unit control circuit 142 by data transfer auxiliary memory row selecting line 250, auxiliary memory memory cell row control line 252, and auxiliary memory memory cell row control line 254.

The data transfer auxiliary memory row selecting line 250 transmits a control signal which controls whether or not a signal stored in the flip flop circuit is outputted to data transfer bus line pair 176, and which controls whether or not a signal transmitted via data transfer bus line pair 176 is incorporated into the flip flop circuit.

The auxiliary memory memory cell row control line 252 transmits a control signal which controls the storage or erasure or the like of the memory contents in the flip flop circuit from the auxiliary memory unit control circuit 142 to the flip flop comprising PMOS transistors 256 and 258. Furthermore, auxiliary memory memory cell row control line 254 transmits a control signal, which controls the storage, erasure, or the like of the memory contents in the flip flop circuit, from the auxiliary memory unit control circuit 142 to the flip flop comprising NMOS transistors 260 and 262.

Next, the inner structure of the auxiliary memory unit control circuit 142 will be explained.

Figure 8:
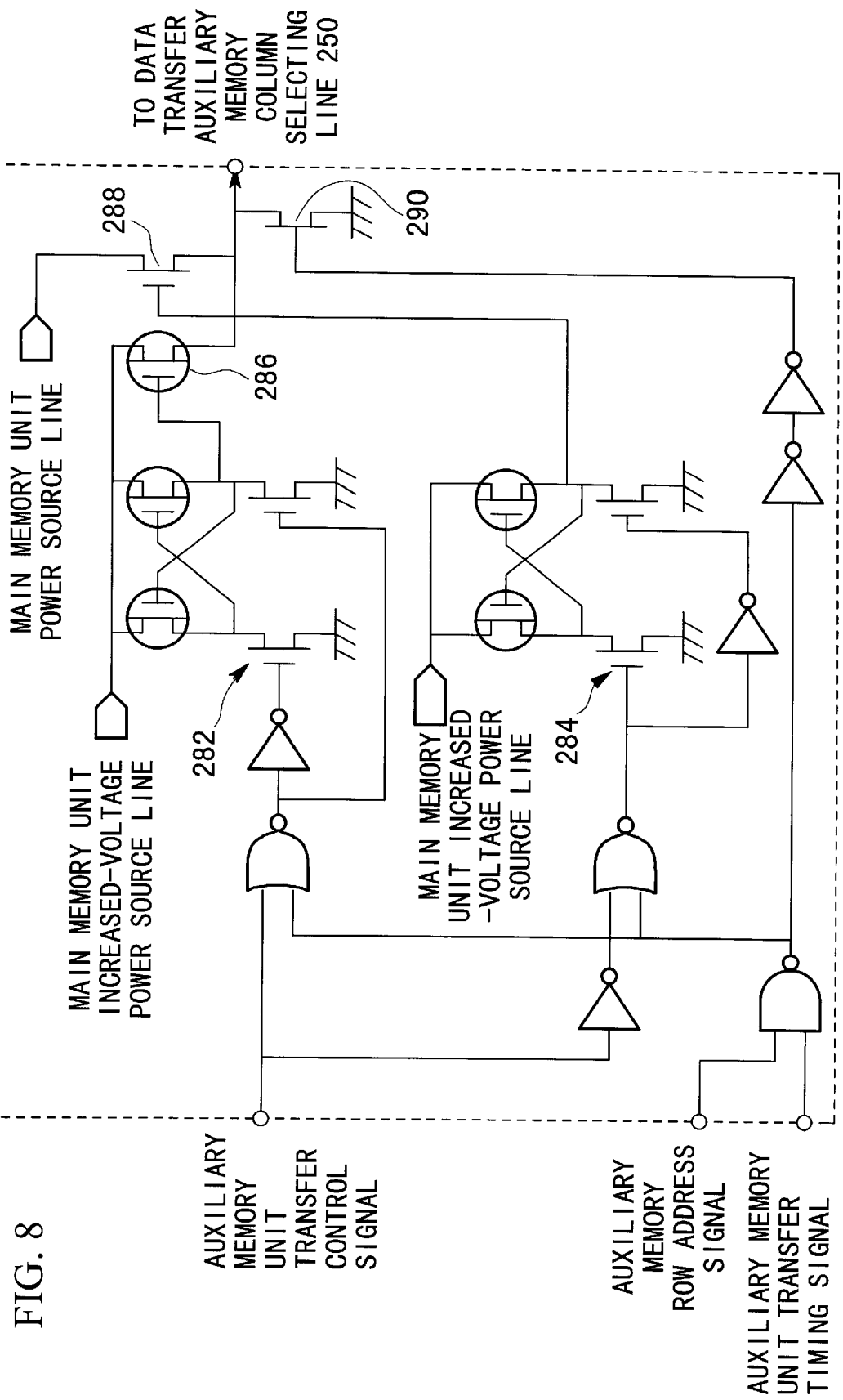
FIG. 8 shows the structure of a data transfer auxiliary memory row selecting line generating circuit 280 provided within an auxiliary memory unit control circuit 142.

FIG. 8 shows the structure of a data transfer auxiliary memory row selecting line generating circuit 280 which is provided within the auxiliary memory unit control circuit 142. This data transfer auxiliary memory row selecting line generating circuit 280 controls whether or not a signal stored in the flip flop circuits comprising PMOS transistors 256 and 258 and NMOS transistors 260 and 262 is outputted to data transfer bus line pair 176, and which controls whether or not a signal transmitted via the data transfer bus line pair 176 is incorporated into memory cell 182, and which controls the power source supplied to the memory cell 182.

Because it is necessary that auxiliary memory unit 102 normally operate at a higher speed than the main memory unit 101, and thus a higher voltage is supplied than the power source voltage supplied to main memory unit 101, that is to say, the main memory unit power source voltage, when data is transferred from the auxiliary memory memory cell 120 to the sense amplifier circuits 174 of main memory unit 101, when the level of the main memory unit increased voltage power source is applied to the data transfer auxiliary memory low selecting line 250, there is a danger that the voltage level of the data transfer bus line pair 176 will be charged to a voltage in excess of the level of the main memory unit power source.

The data transfer auxiliary memory row selecting line generating circuit 280 shown in FIG. 8 is a circuit which, in order to solve the problem described above, in the case in which data is transferred from the auxiliary memory memory cell 120 to the sense amplifier circuit 174 of the main memory unit 101, or in the case in which data is incorporated from the sense amplifier circuits 174 of main memory unit 101 into the auxiliary memory memory cell 120, controls whether the data transmission auxiliary memory row selecting signal which is supplied from the auxiliary memory control circuit 142 via data transfer auxiliary memory row selecting line 250 to the connecting circuit comprising NMOS transistors 264a and 264b is set to the main memory unit power source which is employed as the power source for the main memory unit 101 or is set to the main memory unit increased voltage power source.

Referring to FIG. 8, an auxiliary memory unit transfer control signal, an auxiliary memory row address signal and an auxiliary memory unit transfer timing signal are supplied to the data transfer auxiliary memory row selecting line generating circuit 280. The auxiliary memory unit transfer control signal is a signal which chiefly controls whether the data transfer auxiliary memory row selecting signal is set to the main memory unit power source or to the main memory unit increased voltage power source, and the auxiliary memory row address signal and auxiliary memory unit transfer timing signal are signals which control the timing of transfer. These signals are generated within the auxiliary memory unit control circuit 142.

By means of the auxiliary memory unit transfer control signal, either the output of flip flop 282 or the output of flip flop 284 is set to a high level. The PMOS transistor 286, to which the main memory unit increased voltage power source is supplied, is connected to the output of flip flop 282, while the NMOS transistor 288, to which the main memory unit power source is supplied, is connected to the output of flip flop 284, and the output of both PMOS transistor 286 and of NMOS transistor 288 is connected to the data transfer auxiliary memory row selecting line 250.

Furthermore, a signal resulting from conducting a NAND operation with respect to the auxiliary memory row address signal and auxiliary memory transfer timing signal is supplied to the base NMOS transistor 290 via buffer circuit. This NMOS transistor 290 is connected to the data transfer auxiliary memory row selecting line 250 and is also grounded. In other words, based on the signal resulting from conducting the NAND operation described above, the NMOS transistor 290 activates or deactivates the data transfer auxiliary memory row selecting line 250. When the data transfer auxiliary memory row selecting line 250 is deactivated, the connecting circuit comprising NMOS transistors 264a and 264b is disconnected, so that data transfer does not occur.

(4) Operation

Next, the operation of the semiconductor integrated circuit device in accordance with the first embodiment of the present invention which has the structure described above will be explained.

[Data Transfer from Main Memory Unit 101 to Auxiliary Memory Unit 102]

Figure 9:
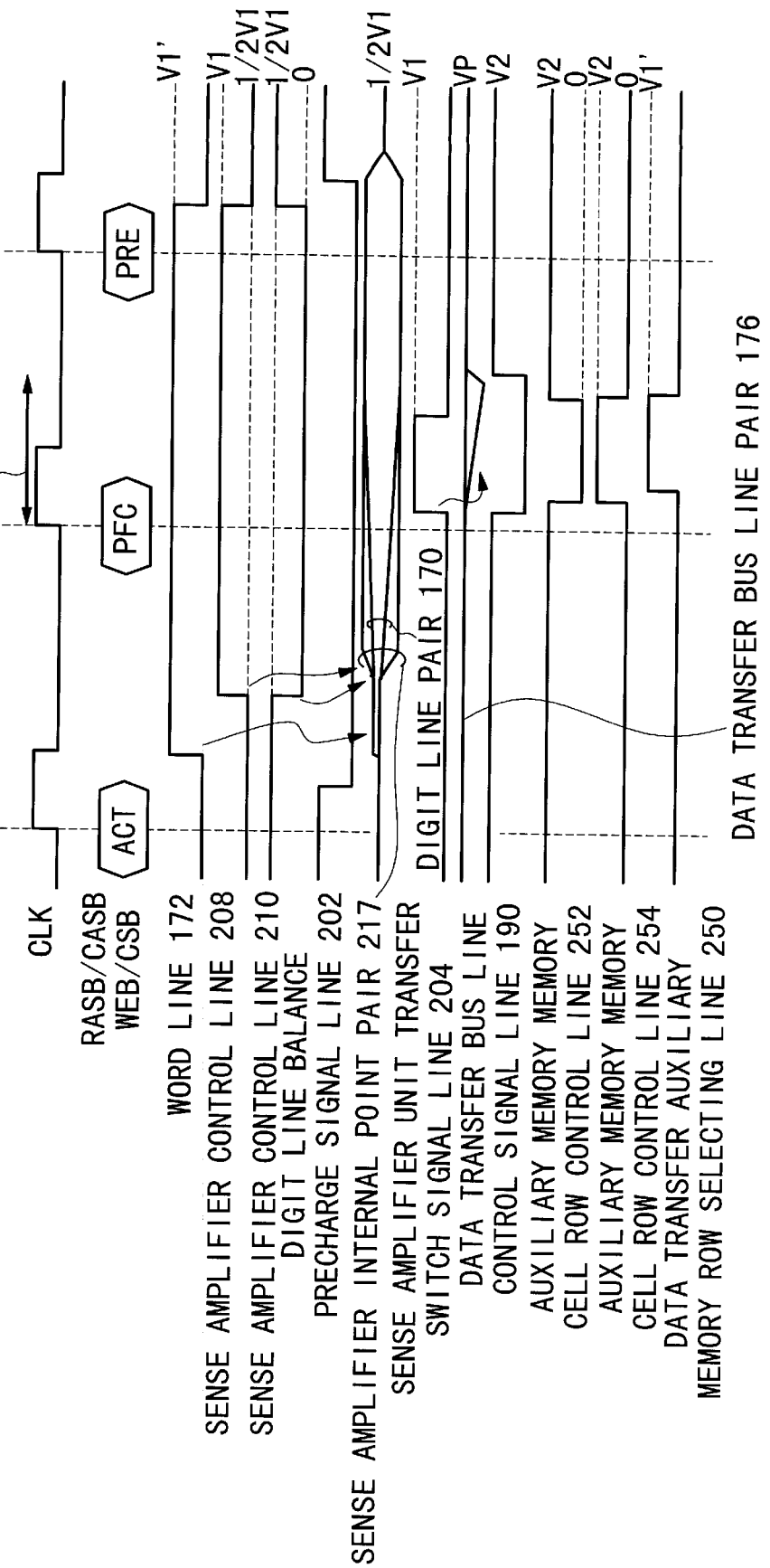
FIG. 9 is a timing chart showing operations when conducting data transfer from a main memory unit 101 to an auxiliary memory unit 102 in a semiconductor integrated circuit device in accordance with a first embodiment of the present invention.

FIG. 9 is a timing chart showing the operation during the conducting of data transfer from main memory unit 101 to auxiliary memory unit 102 in a semiconductor integrated circuit device in accordance with the first embodiment of the present invention.

In FIG. 9, the main memory unit power source level is indicated by V1, the main memory unit increased voltage power source level is indicated by V1', the intermediate potential level is indicated by ½ V1, the precharge level of the data transfer bus line is indicated by VP, the auxiliary memory unit power source level is indicated by V2, and the ground level is indicated by 0.

In FIG. 9, the signals transmitted on each signal line shown in FIGS. 1 through 7 are indicated.

First, when the active command (ACT) is inputted into command decoder 132, sense amplifier control circuit 138 sets the digit line balance precharge signal line 202 to a low level. When this signal line is set to a low level, the digit line balance precharge circuit 200 enters a non-operational state. Next, by means of the main memory row decoder 112, a certain row in the main memory memory cell 110 provided within main memory unit 101 is activated, and as shown in FIG. 9, the word line 172 is set to the main memory unit increased voltage power source level V1'.

When the word line 172 obtains a high level, a signal stored in memory cell 173 is inputted into digit line balance precharge circuit 200 via the digit line. Then, sense amplifier unit control unit 138 sets the level of sense amplifier control line 208 to the main memory unit power source level V1, and sets the level sense amplifier control line 210 to the ground level 0.

When the level of sense amplifier control line 208 is set to the main memory unit power source level V1 and the level of sense amplifier control line 210 is set to the ground level 0, the difference in potential in the sense amplifier internal point pair 217 becomes large, and the difference in potential between digit line pair 170 also gradually increases.

When in this state the transfer command PFC is inputted, the sense amplifier unit control circuit 138 sets the voltage level of the sense amplifier unit transfer switch signal 204 to the main memory unit power source level V1, and NMOS transistors 218 and 220 enter an ON state, and the signal stored in the sense amplifier internal point pair 217 is outputted to the data transfer bus line pair 176. Especially to be noted here is that the voltage level of sense amplifier unit transfer switch signal line 204 is set to the main memory power source level V1.

This is done in order to prevent the problem described above, that when the main memory unit increased voltage power source is applied as the sense amplifier unit transfer switch signal in the case in which data is transferred from the sense amplifier circuit 174 to the data transfer bus line pair 176, because the data transfer bus line pair 176 is set to a level below that of the high side junction level in the sense amplifier circuit 174, this is subtracted by the level of the data transfer bus line pair 176 and the high side junction level within the sense amplifier circuit 174 declines, so that the ability to transfer data from sense amplifier circuit 274 to data transfer bus line pair 176 decreases.

Sense amplifier control circuit 138 sets the voltage level of sense amplifier unit transfer switch signal line 204 to the main memory power source level V1 and simultaneously data transfer bus line control circuit 140 sets the level of data transfer bus line control signal line 190 to a low level, and places the data transfer bus line precharge circuit 152 in a non-operational state.

The signal outputted from sense amplifier 174 to data transfer bus line pair 176 is inputted into auxiliary memory memory cell 182.

Furthermore, at a point in time slightly delayed from the setting of the voltage level of the sense amplifier unit transfer switch signal line 204 to the main memory unit power source level V1 by the sense amplifier control circuit 138 as described above, the auxiliary memory unit control circuit 142 sets auxiliary memory memory cell role control line 252 to the ground level 0, setting the flip flop comprising PMOS transistors 256 and 258 to a non-operational state, and sets the auxiliary memory memory cell low control line 254 to the auxiliary memory unit power source level V2 and places the flip flop comprising NMOS transistors 260 and 262 in a non-operational state.

The auxiliary memory unit control circuit 142 sets the auxiliary memory memory cell row control line 252 to the ground level 0, and after a slight delay from the setting of the auxiliary memory memory cell row control line 254 to the auxiliary memory unit power source level V2, sets the data transfer auxiliary memory row selecting line to the main memory unit increased voltage power source level V1', thus placing the control circuit comprising NMOS transistors 264a and 264b in an open state and incorporating the signal in data transfer bus line pair 176 into the memory cell 182. Here, the reason that the data transfer auxiliary memory row selecting line is set to the main memory unit increased voltage power source V1' when the data transmitted from main memory unit 101 were incorporated is so that an appropriate increase in voltage is obtained, with respect to the gate voltage of NMOS transistors 246a and 246b in order to incorporate data into memory cell 182, with respect to the data transfer bus line level.

Furthermore, when data are incorporated, because the data transfer bus line 176 has a potential which is slightly lower than the power source voltage of main memory unit 101, it is necessary that incorporation be conducted in a state in which the transistors 256, 258, 260 and 262 are within memory cell 182 are in a completely OFF state, and that amplification then be conducted.

In the present embodiment, as shown in FIG. 9, by setting the potential of auxiliary memory memory cell row control lines 252 and 254, which control the source voltage of transistors 256, 258, 260, and 262 provided within memory cell 182, to, respectively, the ground potential 0 and the auxiliary memory unit power source level V2, it is possible to incorporate a signal on data transfer bus line pair 176 after initiating a non-conducting state. The data incorporated into memory cell 182 are stored by setting the level of auxiliary memory row signal lines 252 and 254 to, respectively, the auxiliary memory unit power source level V2 and ground level 0.

By means of the operation described above, the transfer operation is completed. After the completion of transfer, the level of data transfer bus line control signal line 190 becomes the main memory unit increased voltage power source level V1', and the data transfer bus lines are precharged. Next, when the precharge command (PRE) is inputted, the word line 172 is set to a low level, the sense amplifier control lines 208 and 210 are set to the intermediate potential ½ V1, and the digit line balance precharge signal line 202 is set to a high level. What is important to note here is that at the point at which the transfer operation has been completed, a non-transfer state has been achieved, and the data transfer bus line pair 176 is precharged to an intermediate potential which is lower than the power source voltage of the main memory unit; by setting the values in this manner, it is possible to ameliorate the level of the increase in potential in the data transfer auxiliary memory row selecting line.

[Data Transfer from Auxiliary Memory Unit 102 to Main Memory Unit 101]

Figure 10:
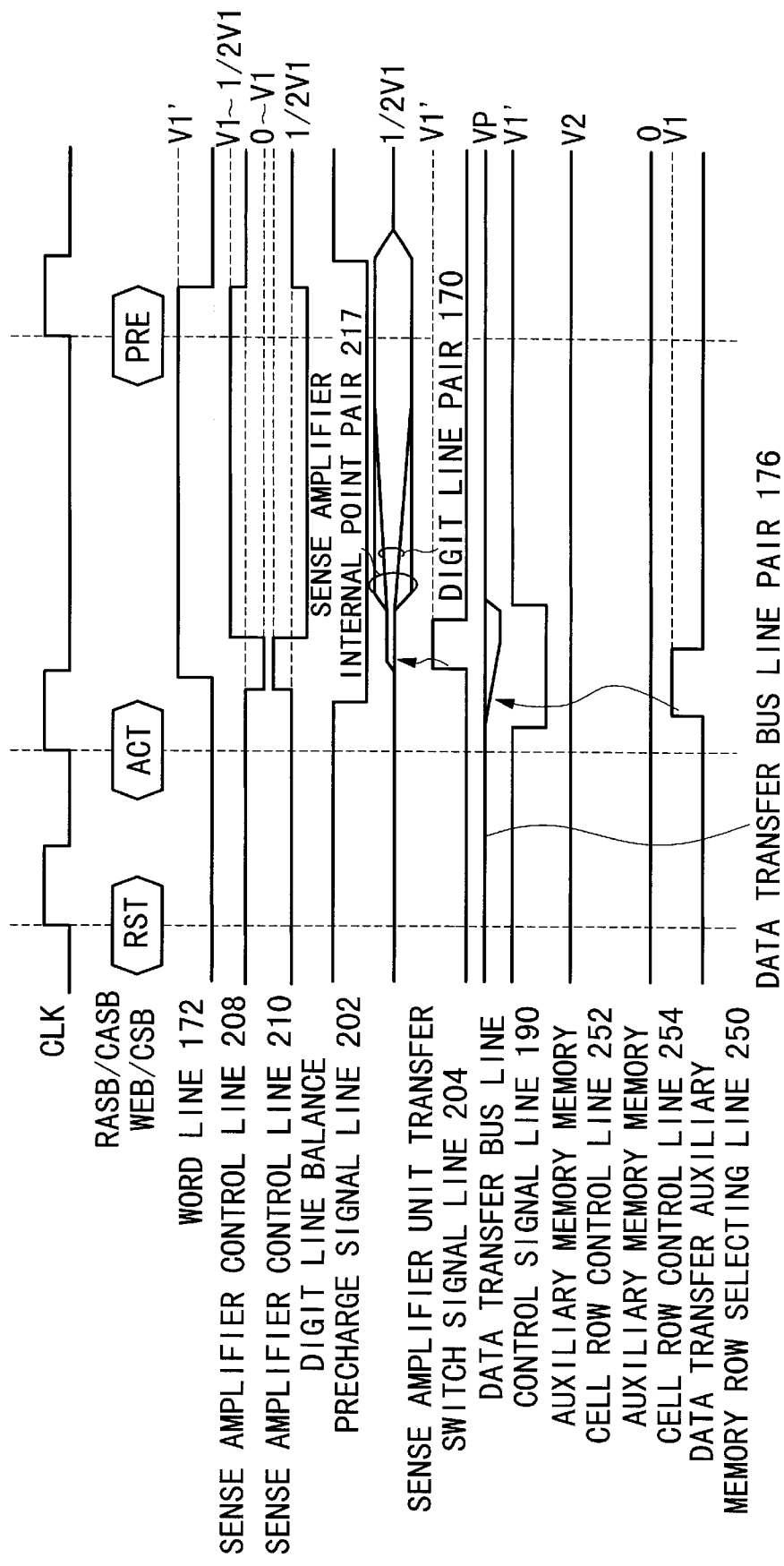
FIG. 10 is a timing chart showing operations when conducting data transfer from an auxiliary memory unit 102 to a main memory unit 101 in a semiconductor integrated circuit device in accordance with the first embodiment of the present invention.

FIG. 10 is a timing chart which shows the operation by which data transfer is conducted from the auxiliary memory unit 102 to the main memory unit 101 in a semiconductor integrated circuit device in accordance with a first embodiment of the present invention.

In FIG. 10, as in FIG. 9, the main memory unit power source level is indicated by V1, the main memory unit increased voltage power source level is indicated by V1', the intermediate potential level is indicated by ½ V1, the data transfer bus line precharge level is indicated by VP, the auxiliary memory unit power source level is indicated by V2, and the ground level is indicated by 0.

In FIG. 10, the signals which were transmitted on the signal lines depicted in FIGS. 1 through 7 are shown.

First, when the transfer command is inputted into command decoder 132 by the successive commands RST and ACT, the data transfer bus line control circuit 140 sets the level of data bus line control signal line 190 from the main memory unit increased voltage power source level V1' to a low level, and sets the precharge circuit 178 to a non-operational state. Next, the auxiliary memory unit control circuit 142 sets the data transfer auxiliary memory row selecting line 250 to the main memory power source level V1.

Here, the reason that the auxiliary memory unit control circuit 142 sets the data transfer auxiliary memory row selecting line 250 to the main memory power source level V1 is so as to prevent the possibility that the voltage level in data transfer bus line pair 176 is charged to a voltage which is higher than the main memory unit power source level when the main memory unit increased voltage power source level is applied to the data transfer auxiliary memory row selecting line 250, in the case in which data are transferred from the auxiliary memory memory cell 120 to the sense amplifier circuits 174 of main memory unit 101, because the power source voltage supplied to the auxiliary memory unit 102 is a higher voltage than the power source voltage of main memory unit 101, as a result of the requirement for higher operating speed.

When the data transfer auxiliary memory row selecting unit 250 is set to the main memory power source level V1, the NMOS transistors 264a and 264b which comprise the connecting circuit enter an ON state, and the signal stored in the flip flop circuits comprising PMOS transistors 256 and 258 and NMOS transistors 260 and 262 is outputted to the data transfer bus line pair 176.

Next, the sense amplifier unit control circuit 138 sets the level of digit line balance precharge signal line 202 to a low level, and the digit line balance precharge circuit 200 enters a non-operational state. Furthermore, the sense amplifier unit control circuit 138 sets the level of the sense amplifier control line 208 from the intermediate potential ½ V1 to the ground level 0 and sets the level of the sense amplifier control line 210 from the intermediate potential ½V1 to the main memory power source level V1.

When the level of the sense amplifier control line 208 is set to the ground level 0, and the level of the sense amplifier control line 210 is set to the main memory power source level V1, then the main memory decoder 112 sets the level of the word line 172 to the main memory unit increased voltage power source level V1'. Then, the sense amplifier unit control circuit 138 sets the level sense amplifier unit transfer switch signal line 204 to the main memory unit increased voltage power source level V1', the control circuit comprising NMOS transistors 218 and 220 enters an open state, and data is incorporated into sense amplifier circuit 174 from data transfer bus line pair 176.

Here, the reason that the level of the sense amplifier transfer switch signal line 204 is set to the main memory unit increased voltage power source level V1' is that it is necessary to apply an appropriate increased voltage with respect to the gate electrodes of NMOS transistors 218 and 220 in order to incorporate the data into sense amplifier circuit 174, with respect to the level of the data transfer bus line.

In the present embodiment, the potential of the sense amplifier control lines 208 and 210, which control the source voltage of the transistors 210, 212, 214, and 216 provided within sense amplifier circuit 174, is first controlled, these are placed in a non-conducting state, and then the signal in data transfer bus line pair 176 is incorporated.

When data is incorporated by sense amplifier circuit 174, auxiliary memory unit control circuit 142 sets the level of data transfer auxiliary memory row selecting line 250 to a low level, and the electrical connection between data transfer bus line pair 176 and the flip flop circuit within memory cell 182 is broken.

After this, the sense amplifier unit control circuit 138 sets the level of the sense amplifier control line 208 to the main memory power source level V1, and sets the level of sense amplifier control line 210 to a low level. Then, the sense amplifier unit control circuit 138 sets the level of the sense amplifier unit transfer switch signal line 204 to a low level, and thus breaks the electrical connection between the sense amplifier circuit 174 and the data transfer bus line pair 176. Next, the data transfer bus line control circuit 140 sets the level of the data transfer bus line control signal line 190 to the main memory unit increased voltage power source level V1'. By means of the above operations, the transfer operation is completed.

In this state, the signal incorporated into sense amplifier circuit 174 is amplified by the flip flop comprising PMOS transistors 210 and 212 and the flip flop comprising NMOS transistors 214 and 216, and as shown in FIG. 10, the difference in potential in the sense amplifier internal point pair 217 becomes large, and the difference of potential in the digit line pair 170 slowly increases.

The data of the digit line pair 170 are incorporated into main memory memory cell 110. Next, when the precharge command (PRE) is inputted, main memory row decoder 112 sets word line 172 to a low level, and sense amplifier unit control circuit 138 sets the level of sense amplifier control line 208 and the level of sense amplifier control line 210 to the intermediate potential level ½ V1.

The sense amplifier unit control circuit 138 sets the digit line balance precharge signal line 202 to a high level, and when the digit line balance precharge circuit 200 enters an operational state, the transfer operation is completed.

[Increasing Speed of Data Transfer from Main Memory Unit 101 to Auxiliary Memory Unit 102]

In the data transfer from main memory unit 101 to auxiliary memory unit 102 which was explained with reference to FIG. 9, because there is an overlap between the digit line amplification amplification operation period and the data transfer operation period, the data transfer tends to be delayed. Next, the operation of a semiconductor integrated circuit device in accordance with the first embodiment of the present invention which aims to achieve an increase in speed in data transfer from main memory unit 101 to auxiliary memory unit 102 will be explained.

Figure 11:
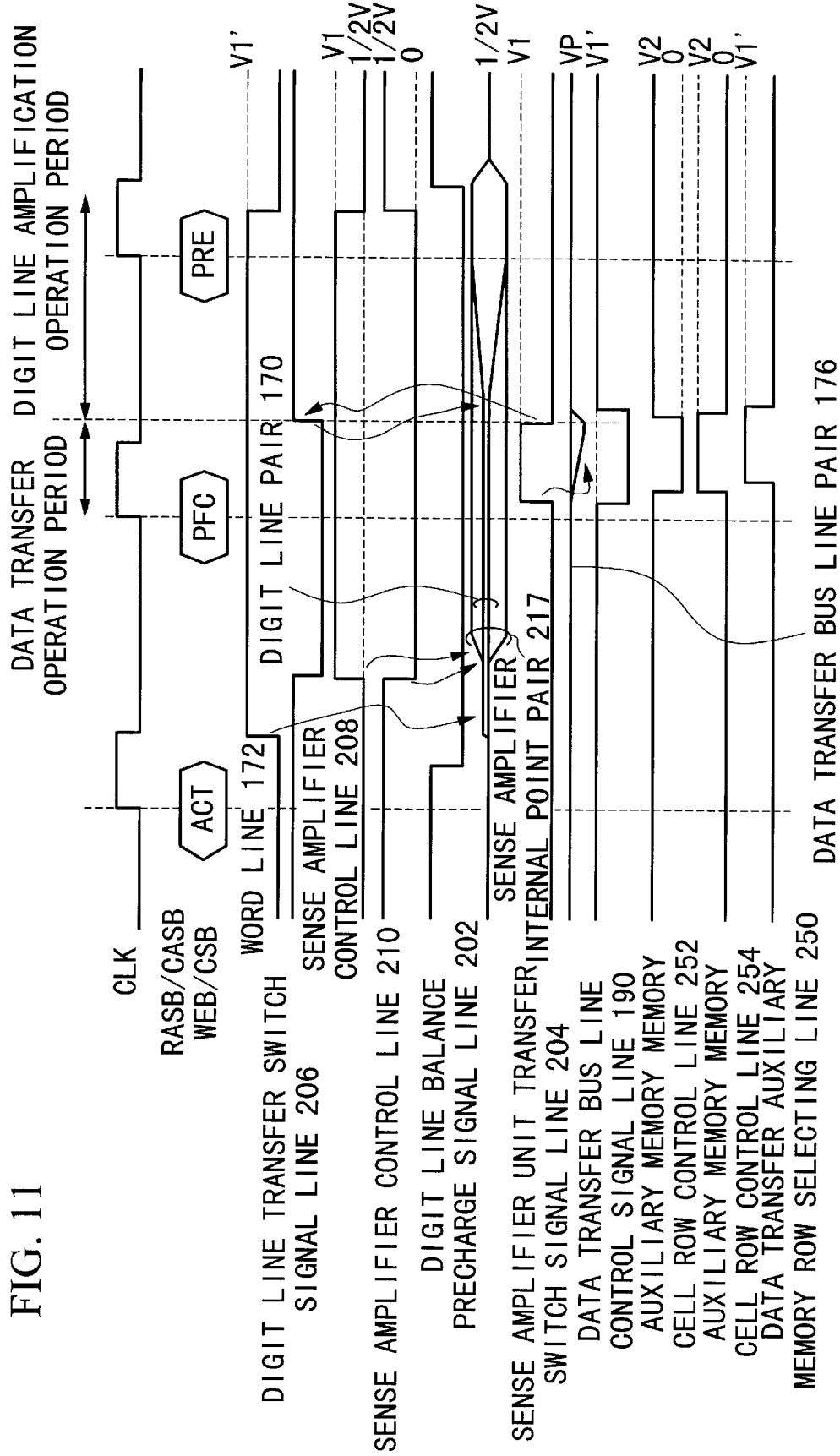
FIG. 11 is a timing chart showing operations when the speed of data transfer from main memory unit 101 to an auxiliary memory unit 102 is to be increased in a semiconductor integrated circuit device in accordance with a first embodiment of the present invention.

FIG. 11 is a timing chart showing the operation in the case in which an increase in speed is desired in data transfer from main memory unit 101 to auxiliary memory unit 102, in the semiconductor integrated circuit device in accordance with the first embodiment of the present invention.

In FIG. 11, the main memory unit power source level is indicated by V1, the main memory unit increased voltage power source level is indicated by V1', the intermediate potential level is indicated by ½V1, the data transfer bus line precharge level is indicated by VP, the auxiliary memory unit power source level is indicated by V2, and the ground level is indicated by 0.

In FIG. 11, the signals transmitted on the signal lines depicted in FIGS. 1 through 7 are shown.

First, when the active command (ACT) is inputted into the command decoder 132, the sense amplifier unit control circuit 138 sets the digit line balance precharge signal line 202 to a low level. When this signal line attains a low level, the digit line balance precharge circuit 200 enters a non-operational state. Next, a certain row of the main memory memory cell 110 provided within main memory unit 101 is activated by the main memory row decoder 112, and as shown in FIG. 9, the word line 172 is set to the main memory unit increased voltage power source level V1'.

When the word line 172 attains a high level, the signal stored in memory cell 173 is read out to the digit line. Next, sense amplifier unit control circuit 138 sets the level of the sense amplifier control line 208 to the main memory unit power source level V1, and sets the level of sense amplifier control line 210 to the ground level 0.

Noteworthy here is that, when the level of sense amplifier control line 208 is set to the main memory unit power source level V1 and the level of sense amplifier control line 210 is set to the ground level 0, sense amplifier unit control circuit 138 sets the level of the digit line transfer switch signal line 206 to a low level, NMOS transistors 222 and 224 enter an OFF state, and the electrical connection between sense amplifier circuit 174 and digit line pair 170 is broken.

When the level of sense amplifier control line 208 is set to the main memory unit power source level V1 and the level of the sense amplifier control line 210 is set to the ground level 0, then a large potential difference develops in the sense amplifier internal point pair 217, and the difference in potential in the digit line pair 170 gradually increases.

At this time, sense amplifier circuit 174 is electrically disconnected from digit line 170, so that amplification of digit line pair 170 is not conducted, and the load with respect to impedance of the ground power source line is smaller than in the case shown in FIG. 9, so that the discharge from the data transfer bus line pair 176 is accomplished more quickly, and a shorter period of time passes until the necessary difference in potential is reached.

When the transfer command (PFC) is inputted and the sense amplifier unit control circuit 138 sets the voltage level of sense amplifier unit transfer switch signal line 304 to the main memory power source level V1, the NMOS transistors 218 and 220 enter an ON state, and the signal stored in the internal point pair 217 of the sense amplifier is outputted to the data transfer bus line pair 176. Noteworthy here is that the voltage level of the sense amplifier unit transfer switch signal line 204 was set to the main memory power source level V1.

As described above, the reason for this is to prevent the situation in which, because the data transfer bus line pair 176 is set to a lower level than that of the high side junction level within sense amplifier circuit 174, this is subtracted by the level of data transfer bus line pair 176 and the high side junction level within sense amplifier circuit 174 declines, thus reducing the ability to transfer data from the sense amplifier circuit 274 to the data transfer bus line pair 176 when the main memory unit increased voltage power source is applied as the sense amplifier unit transfer switch signal, in the case in which data are transferred from sense amplifier circuit 174 to data transfer bus line pair 176.

The sense amplifier control circuit 138 sets the voltage level of sense amplifier unit transfer switch signal line 204 to the main memory power source level V1, and simultaneously, the data transfer bus line control circuit 140 sets the level of data transfer bus line control signal line 190 to a low level, and data transfer bus line precharge circuit 152 enters a non-operational state.

The signal is outputted from sense amplifier circuit 174 to data transfer bus line pair 176, and is inputted into memory cell 182.

Furthermore, sense amplifier control circuit 138 sets the voltage level of sense amplifier unit transfer switch signal line 204 to the main memory power source level V1, and then, at a slight delay, auxiliary memory unit control circuit 142 sets auxiliary memory memory cell row control line 252 to the ground level 0, and the flip flop comprising PMOS transistors 256 and 258 enters a non-operational state, and the auxiliary memory memory cell row control line 254 is set to the auxiliary memory unit power source level V2, and the flip flop comprised of NMOS transistors 260 and 262 enters a non-operational state.

Auxiliary memory unit control circuit 142 sets auxiliary memory memory cell row control line 252 to the ground level 0, and sets auxiliary memory memory cell row control line 254 to the auxiliary memory unit power source level V2, and then, at a slight delay, sets the data transfer auxiliary memory row selecting line to the main memory unit increased voltage power source level V1', so that the connecting circuit comprising NMOS transistors 264a and 264b enters an open state, and the signal in data transfer bus line pair 176 is incorporated into memory cell 182. Here, the reason that the data transfer auxiliary memory row selecting line is set to the main memory unit increased voltage power source level V1' while incorporating data transferred from main memory unit 101 is so as to achieve, with respect to the data transfer bus line level, an appropriate increased potential level with respect to the gate electrodes of NMOS transistors 264a and 264b in order to incorporate the data into memory cell 182.

Furthermore, when the data is incorporated, as a result of the fact that data transfer bus line 176 has a potential which is slightly below that of the power source voltage main memory unit 101, it is necessary that the transistors 256, 258, 260, and 262 within memory cell 182 be placed in an OFF state, the data be incorporated, and then amplified.

In the present embodiment, as shown in FIG. 9, the potential of the auxiliary memory memory cell row control lines 252 and 254, which control source voltages of the transistor 256, 258, 260 and 262 provided within memory cell 182, are set, respectively, to the ground potential 0 and auxiliary memory unit power source level V2, and thereby, these transistors are placed in a non transmitting state, and then the signal in data transfer bus line pair 176 is incorporated. The data incorporated into memory cell 182 is stored by setting the level auxiliary memory row control signal lines 252 and 254 to, respectively, auxiliary memory unit power source level V2 and ground level 0.

By means of the operations described above, the transfer operation is terminated. When the transfer operation is terminated, the sense amplifier unit control circuit 138 sets the sense amplifier unit transfer switch signal line 204 to a low level, and sets the digit line transfer switch signal 206 to a high level, and thus conducts the amplification operation of the digit line pair 170.

Next, when the precharge command (PRE) is inputted, the word line 172 is set to a low level, the sense amplifier control lines 208 and 210 are set to the intermediate potential ½V1, and the digit line balance precharge signal line 202 is set to a high level, and thus the transfer operation is completed.

When a plurality of segments are present, the amplification of the digit line pairs belonging to all segments may be conducted after terminating the transfer operation.

A semiconductor integrated circuit device in accordance with the first embodiment of the present invention was explained above based on the simplified model diagram shown in FIG. 2. This embodiment simply served to facilitate understanding; the present invention should not be interpreted as restricted thereto.

Figure 12:
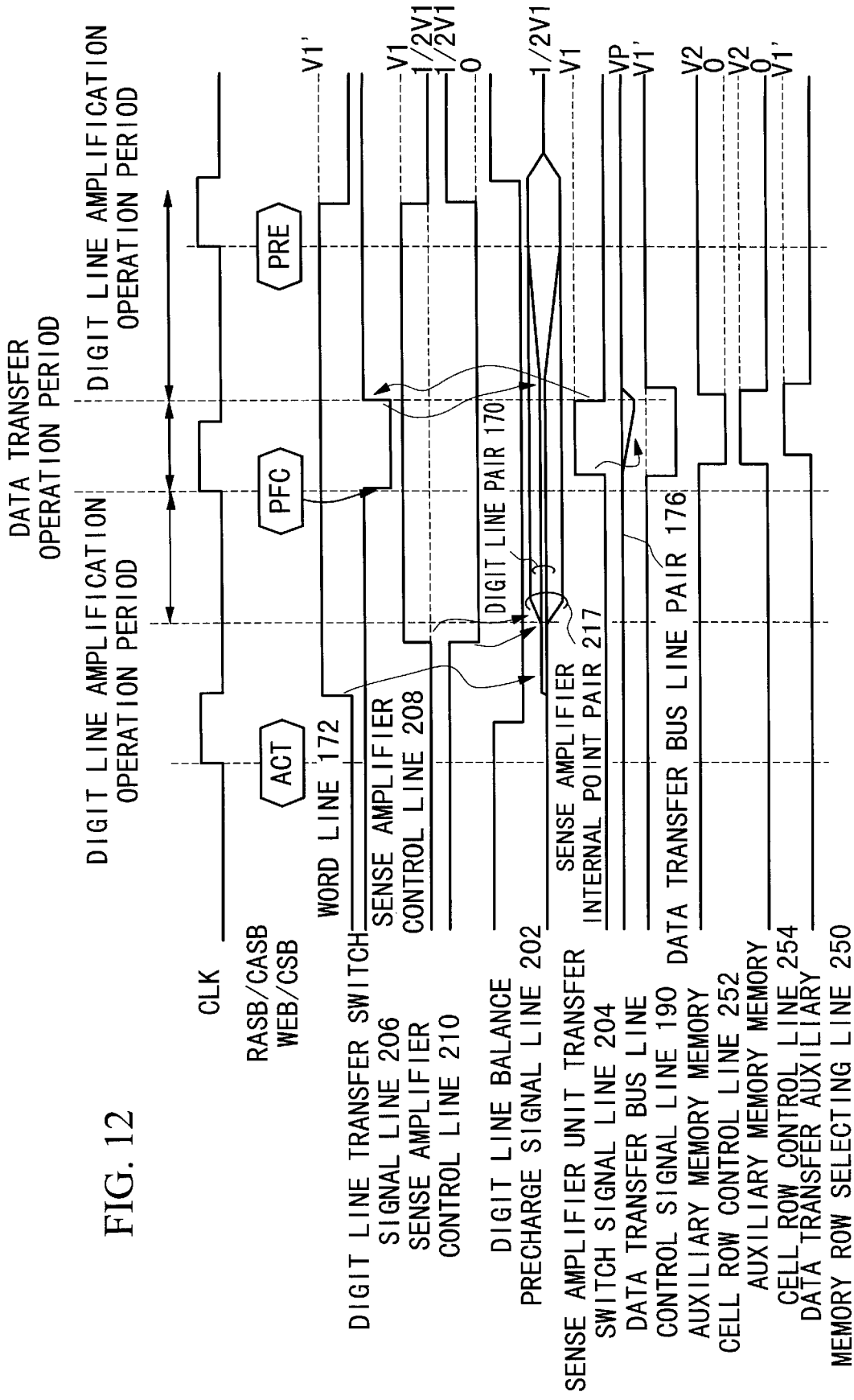
FIG. 12 is a timing chart showing another example of operations for data transfer from main memory unit 101 to auxiliary memory unit 102 in a semiconductor integrated circuit device in accordance with the first embodiment of the present invention.

Furthermore, the operation depicted in FIG. 12 is also possible. FIG. 12 is a timing chart showing another example of operations during the data transfer from main memory unit 101 to auxiliary memory unit 102 in a semiconductor integrated circuit device in accordance with the first embodiment of the present invention. The main difference between the timing chart shown in FIG. 12 and that shown in FIG. 11 is that, when the transfer command (PFC) is inputted in FIG. 12, the level of the digit line transfer switch signal line 206 is set to a low level and the amplification operation of digit line pair 170 is temporarily suspended as data transfer is conducted. After the termination of the transfer operation, the level of the data transfer switch signal line 206 is set to a high level, and the amplification operation of digit line pair 170 is conducted, which is the same as in FIG. 11.

In the timing chart shown in FIG. 11, after the input of the active command (ACT), in a continuous operation encompassing sense amplifier activation, the digit line transfer switch signal line 206 is set to a low level and the sense amplifier internal point pair 217 is amplified to a certain level. When the transfer command (PFC) is inputted in this state, the transfer operation is initiated. Then, after the termination of the transfer operation, the level of the digit line transfer switch signal line 206 is again set to a high level, and the amplification of digit line pair 170 is conducted. When such operations are conducted, until the input of a transfer command (PFC), the state is one in which the digit line pair 170 remains in a state in which it is electrically disconnected from the sense amplifier circuit 174 until the termination of the transfer operation, so that the timing at which the transfer command (PFC) is inputted is delayed, and waste is produced in the time from the input of the active command (ACT) until the input of the precharge command (PRE).

When the operations of the timing chart shown in FIG. 12 are conducted, the case is one in which it is possible to conduct amplification operations of the digit line pair 170 prior to initiating the data transfer operation by means of the timing at which the transfer command (PFC) is inputted, so that when the timing at which the transfer command (PFC) is inputted is delayed, it is possible to effectively employ the time from the input of the active command (ACT) to the input of the precharge command (PRE).

Figure 13:
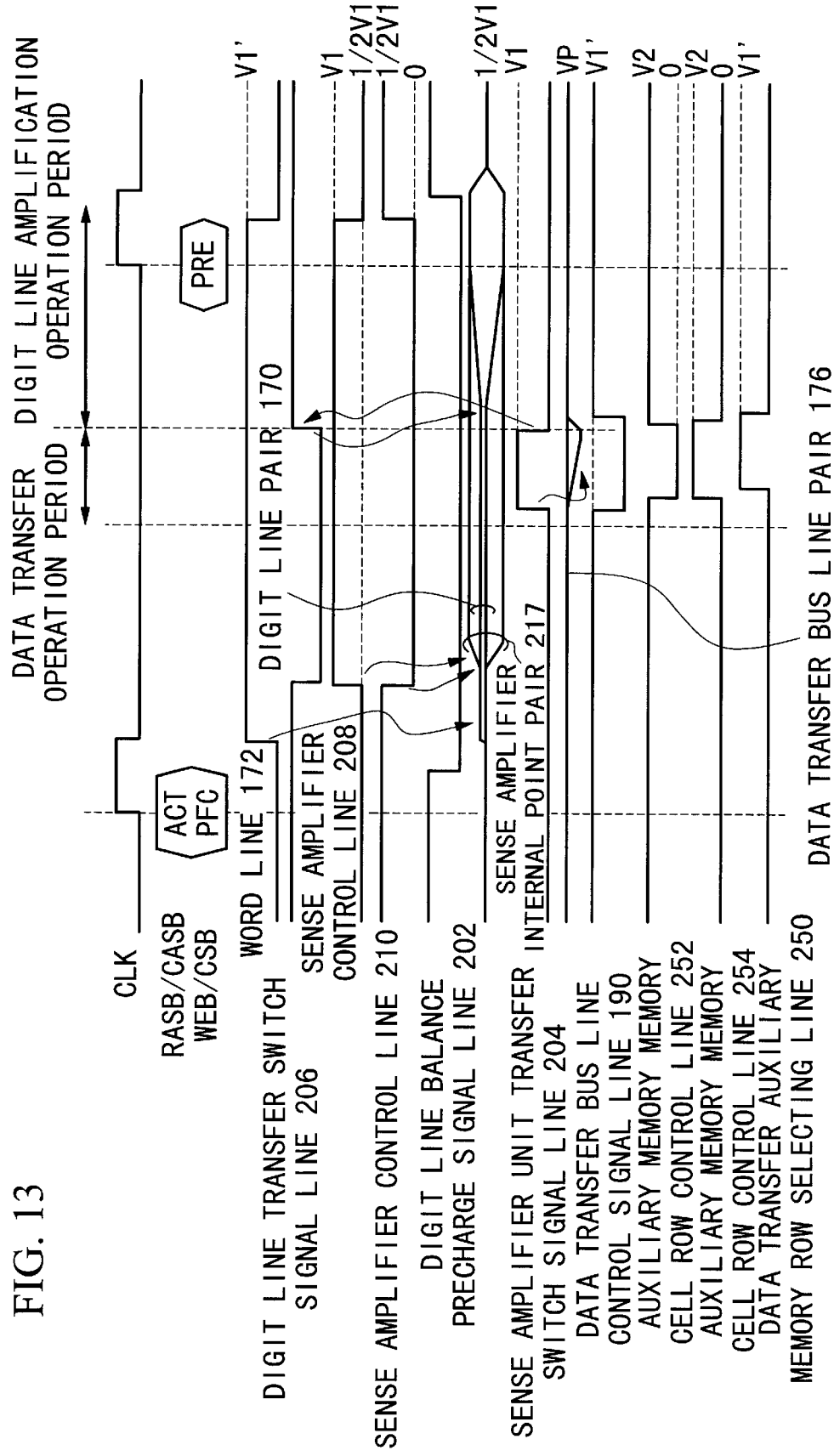
FIG. 13 is a timing chart showing another example of data transfer operations from main memory unit 101 to auxiliary memory unit 102 in a semiconductor integrated circuit device in accordance with the first embodiment of the present invention.

Furthermore, the operation shown in FIG. 13 is also possible. FIG. 13 is a timing chart showing another example of operations for data transfer from main memory unit 101 to auxiliary memory unit 102 in a semiconductor integrated circuit device in accordance with the first embodiment of the present invention. The timing chart shown in FIG. 13 is almost identical to the timing chart shown in FIG. 11; however, in the timing chart shown in FIG. 13, the active command (ACT) which initiates operation and the transfer command (PFC) which initiates the transfer operation are one command. By making the active command (ACT) and the transfer command (PFC) into one command, it becomes possible to conduct operations while setting internally optimal timings from the input of the active command (ACT) to the termination of the data transfer operation, so that it is possible to more effectively use time, and as a result, this is extremely advantageous when the operational frequency (CLK frequency) is increased.

[Second Embodiment]

The fundamental structure and block diagram of a semiconductor integrated circuit device in accordance with the second embodiment of the present invention is fundamentally the same as the fundamental structure and block diagram of semiconductor integrated circuit shown in FIG. 1.

The difference between the semiconductor integrated circuit in accordance with the second embodiment of the present invention and the semiconductor integrated circuit in accordance with the first embodiment of the present invention is that the row of main memory unit 101 is divided into plurality of rows. Hereinbelow, this division of main memory unit 101 into a plurality of rows will be termed a division thereof into a plurality of segments.

(1) Model Diagram

Next, data transfer conducted between the main memory memory cell 110 and the auxiliary memory memory cell 120 in the second embodiment of the present invention will be discussed.

Figure 14:
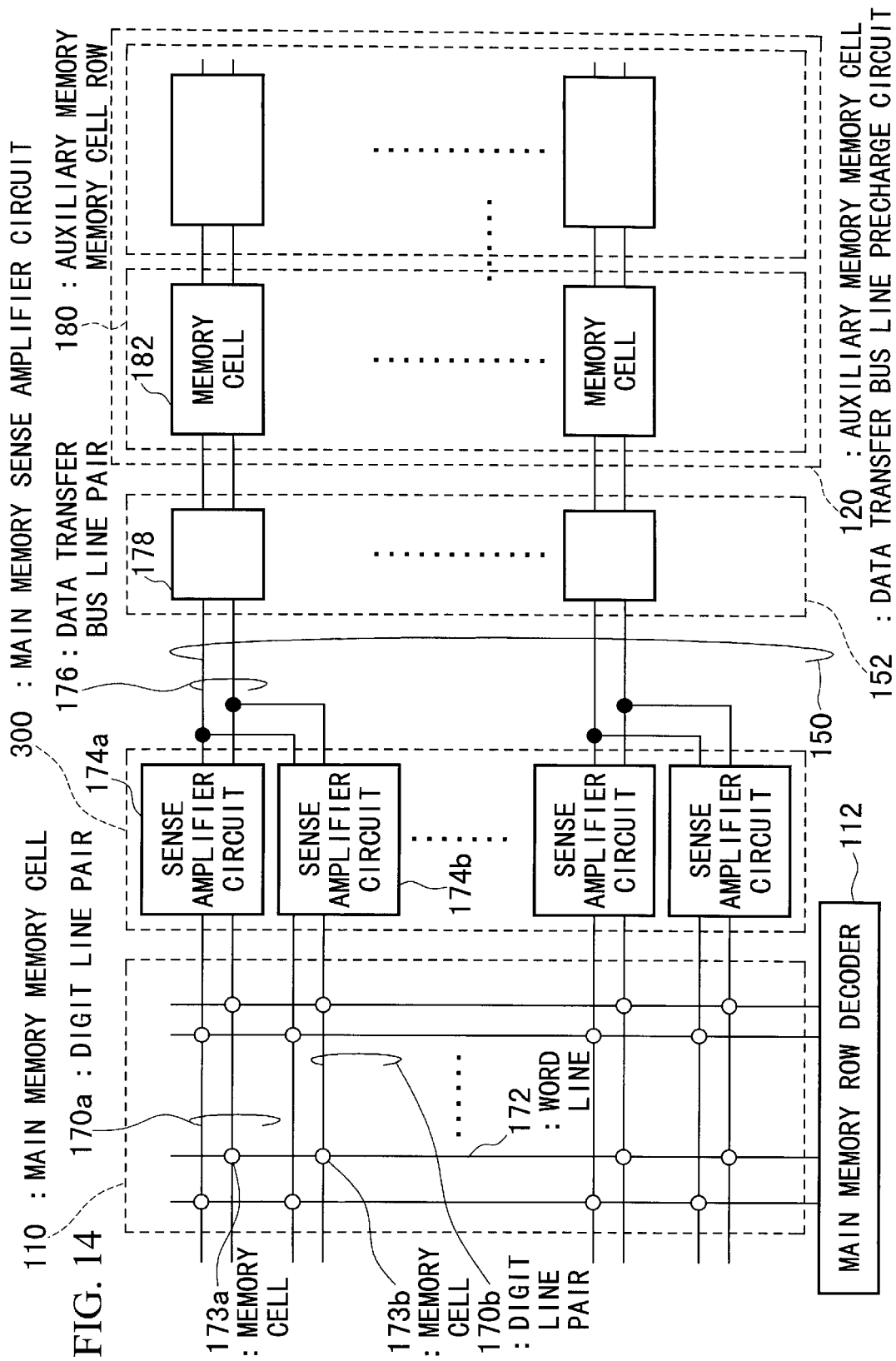
FIG. 14 shows in simplified form the connection relations between the main memory memory cells 110 and the auxiliary memory memory cells 120 in FIG. 1, in accordance with a second embodiment.

FIG. 14 shows, in simplified form, the connection relationships between the main memory memory cell 110 and the auxiliary memory memory cell 120 of FIG. 1 in accordance with the second embodiment. In FIG. 14, two sense amplifier circuits of main memory unit 101 correspond to a single memory cell column of auxiliary memory unit 102. However, the present invention is not necessarily limited to the structure depicted in FIG. 14, so that for example, a structure is also possible in which a single auxiliary memory memory cell column corresponds to a plurality of adjacent sense amplifier circuits of main memory unit 101 (plural segments).

In the present embodiment, the reason for the division into a plurality of segments is that, when data transfer bus lines 150 are provided in such a manner as to correspond in a one to one fashion with the sense amplifier circuits within the main memory sense amplifier circuit 300, this results in a crowded layout pitch of the data transfer bus line 150 in the memory cell array, and the structure becomes complex, and this division facilitates the wiring pitch of the data transfer bus lines. It is preferable that the number of segments be two or four. By means of this division into segments, for example, where the scale of the main memory memory cell 110 is large, even for example where it is doubled or four times larger, the number of segment divisions can simply be increased to two or four. In other words, it is not necessary to increase the number of data transfer bus line pairs 176, data transfer bus line precharge circuits 152, or the scale of the auxiliary memory memory cell 120.

Hereinbelow, the model diagram shown in FIG. 14 will explained in detail.

In FIG. 14, reference 110 indicates a main memory memory cell, wherein digit line pair 170a and 170b and word lines 172, which are connected to the main memory row decoder 112, are arranged so as to intersect at a number of points, and memory cells 173a and 173b are formed at these points of intersection. In comparing the main memory memory cell 110 depicted in FIG. 14 with the main memory memory cell shown in FIG. 2, the reference numbers assigned to the memory cell and to the digit lines are different. This is simply done in order to facilitate the explanation by indicating that memory cell and digit lines are assigned to different segments, and does not imply a difference in the structure itself. Here, if the number of data transfer bus lines 150 is identical to that in the case of FIG. 2, then the scale of main memory memory cell shown in FIG. 14 is twice that of the main memory memory cell shown in FIG. 2. In the present embodiment, the case will be explained in which the number of segment divisions is two.

The digit line pairs 170a and 170b are connected to the sense amplifier circuits 174a and 174b within the main memory sense amplifier circuit 300. The main memory sense amplifier circuit 300 shown in FIG. 14 is fundamentally identical to the main memory sense amplifier circuit 114 shown in FIG. 2; however, sense amplifier circuits 174a and 174b are divided into a plurality of segments, and are connected to the same data transfer bus line pair 176.

A plurality of sense amplifier circuits 174a and 174b are provided with respect to the digit line pairs 170a and 170b within main memory memory cell 110. Digit lines 170a and 170b, memory cells 173a and 173b and sense amplifier circuits 174a and 174b are distinguished using the designations "a" and "b"; however, this simply means that they belong to differing segments (in the present embodiment, an example is explained which has a structure having two segments), and this does not mean that the structures thereof differ. In FIG. 14, although the details thereof are omitted, adjacent sense amplifier circuits belong to differing segments.

A precharge circuit 178 is provided within data transfer bus line precharge circuit 152 for each data transfer bus line pair 176. The number of such precharge circuits 178 is equal to the number of data transfer bus line pairs 176.

As shown in FIG. 14, auxiliary memory memory cell 120 comprises a plurality of auxiliary memory memory cell rows 180, and in the various auxiliary memory memory cell rows 180, a memory cell 182 is provided for each data transfer bus line pair 176.

As described above, it should be borne in mind that FIG. 14 depicts the present embodiment in simplified form in order to facilitate an understanding thereof.

The internal structure of the data transfer bus line precharge circuit 152 and auxiliary memory memory cell row 180 shown in FIG. 14 is identical to that in the first embodiment, so that an explanation thereof will be omitted here. The data transfer bus line precharge power source circuit 154 shown in FIG. 1 is also provided in the present embodiment.

Next, the details of the internal structure of the main memory sense amplifier circuit 300 depicted in FIG. 14 will be explained.

[Main Memory Sense Amplifier Circuit 300]

Figure 15:
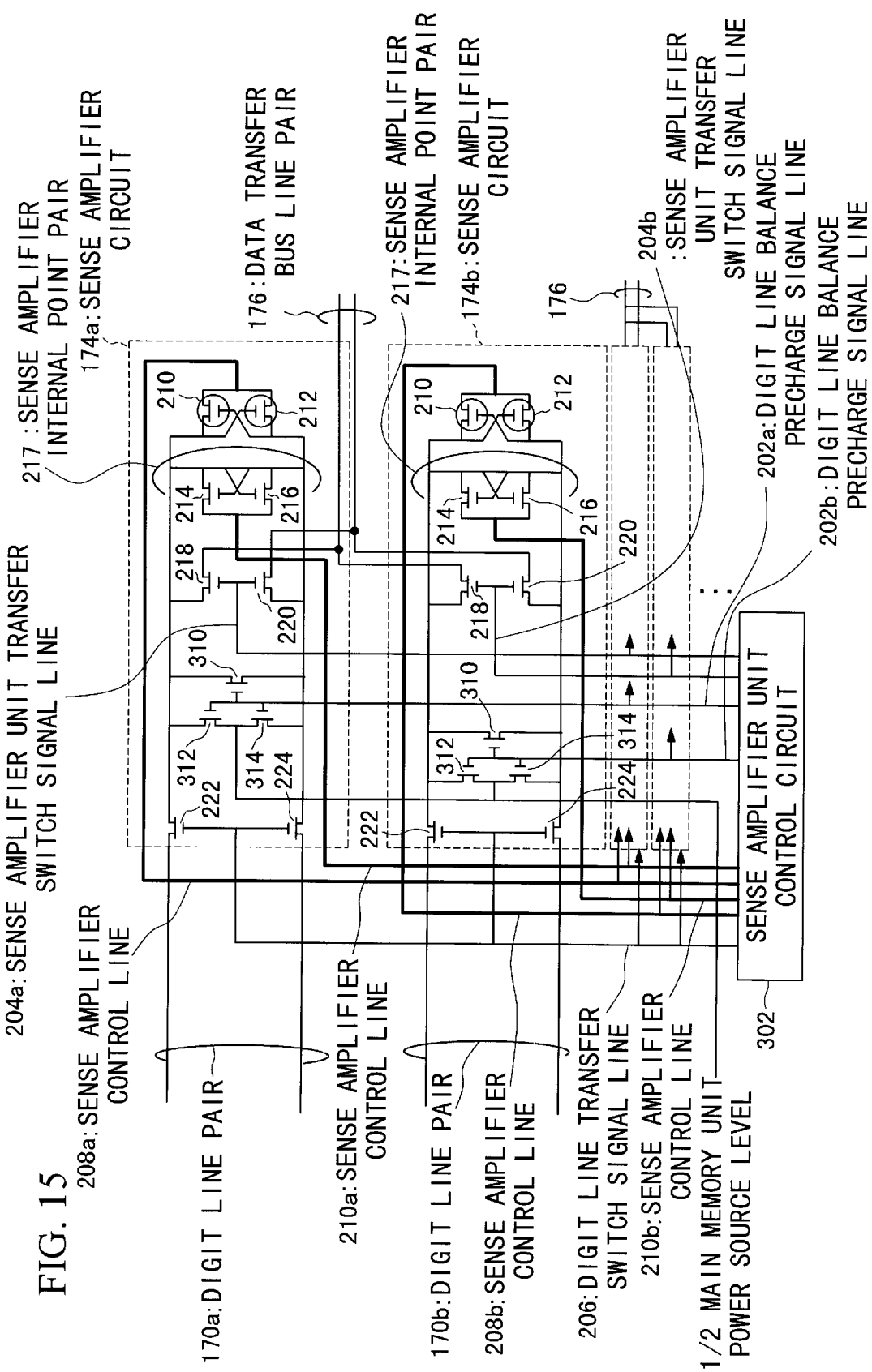
FIG. 15 shows the structure of a main memory sense amplifier circuit 300.

FIG. 15 shows the structure and the like of the main memory sense amplifier circuit 300; those parts which are the same as in FIGS. 1 through 14 are given identical reference numbers. In the main memory sense amplifier circuit 114 of the first embodiment shown in FIG. 5, the structure which was explained was one in which the digit line balance precharge circuit 200 was provided outside the sense amplifier circuit 174; however, in the present embodiment, the case will be explained in which the digit line balance precharge circuit is provided within the sense amplifier circuit.

As is shown in FIG. 15, a sense amplifier circuit 174a is provided for the digit line pair 170a, and a sense amplifier circuit 174b is provided for the digit line pair 170b. Digit line pair 170a and sense amplifier circuit 174a, and digit line pair 170b and sense amplifier circuit 174b, belong to differing segments.

In sense amplifier circuits 174a and 174b, a flip flop circuit and digit line balance precharge circuit comprising NMOS transistors 310, 312, and 314 are provided. The flip flop circuit comprises PMOS transistors 210 and 212 and NMOS transistors 214 and 216.

Furthermore, connecting circuits which are connected to, respectively, digit line pair 170a and data transfer bus line pair 176, and digit line pair 170b and data transfer bus line pair 176, are provided in sense amplifier circuits 174a and 174b. These connecting circuits comprise NMOS transistors 218 and 220. The NMOS transistors 222 and 224 which are provided for digit line pairs 170a and 170b are switch transistors provided to 170a and 170b.

Furthermore, sense amplifier unit control circuit 302 is a part which corresponds to the sense amplifier control circuit 138 shown in FIG. 5; however, in the present embodiment, because this is divided into two segments, the operation is different. The chief points of difference between the sense amplifier unit control circuit 302 shown in FIG. 15 and the sense amplifier unit control circuit 138 shown in FIG. 5 are that, during data transfer, one of the sense amplifier circuits within one or the other of the segments to which sense amplifier circuit 174a belongs (hereinbelow referred to as the first segment) and the segment to which sense amplifier circuit 174b belongs (hereinbelow referred to as the second segment) is connected to the data transfer bus line pair 176 so as to be capable of data transfer. In other words, when data transfer is conducted, the sense amplifier circuit within the first segment and the sense amplifier circuit within the second segment are not simultaneously connected to the data transfer bus line pair 176.

The digit line balance precharge signal lines 202a and 202b, which are connected to the digit line balance precharge circuit provided within sense amplifier circuits 174a and 174b, are connected to the sense amplifier unit control circuit 302, and in addition, the digit line transfer switch signal line 206, the sense amplifier unit transfer switch signal lines 204a and 204b, the sense amplifier control lines 208a and 208b and the sense amplifier control lines 210a and 210b are also connected to the sense amplifier unit control circuit 302.

The digit line balance precharge signal lines 202a and 202b described above transmit control signals for controlling the precharge level in the digit line balance precharge circuits from the sense amplifier unit control circuit 302 to the digit line balance precharge circuits, while digit line transfer switch signal line 206 serves to transmit a control signal, which controls whether or not the sense amplifier circuits 174a and 174b are connected to the digit line pairs 170a and 170b, to NMOS transistors 222 and 224.

Furthermore, the sense amplifier unit transfer switch signal lines 204a and 204b transmit the control signals which determine whether or not the signals which were incorporated in sense amplifier circuits 174a and 174b and were sense amplified by the sense amplifier internal point pair 217 are to be outputted to the data transfer bus line pair 176, and furthermore, whether signals transmitted via data transfer bus line pairs 176 are to be incorporated into the sense amplifier circuit 174.

The semiconductor integrated circuit device in accordance with the present embodiment accomplishes data transfer in units of 1024 bits per data transfer. In this case, in order reduce power consumption, the level of the signal is suppressed, and is less than or equal to 10% of the power source voltage supplied to the main memory unit 101.

In this way, because the level of the signal is low, when the signal is incorporated into the sense amplifier circuits 174a and 174b as shown in FIG. 14, if the initial potential of the data transfer bus line is set to be the power source voltage of the main memory unit 101, then it is necessary to set the level of the sense amplifier unit transfer switch signal, which is supplied to the connecting circuits comprising MOS transistors 218 and 220 via sense amplifier unit transfer switch signal lines 204a and 204b from sense amplifier unit control circuit 302, to a higher voltage. Accordingly, in order to reduce the level of the voltage increase, the precharge level of data transfer bus line pair 176 when transfer is not occurring is set to an intermediate potential below the power source voltage of the main memory unit. An example of this intermediate potential is a value which is half that of the power source voltage of the main memory unit.

Furthermore, this intermediate potential is generated by applying a data transfer bus line level standard potential to the data transfer bus line precharge power source circuit 154 which is shown in FIG. 4, and the intermediate potential is generated from an independent power source, so that noise resulting from fluctuations in the power source voltage as a result of the operation of other circuit elements has no effect on the data transfer bus line pair 176.

Furthermore, sense amplifier circuit lines 208a and 208b transmit the control signals which control the amplification ratio of the flip flop comprising PMOS transistors 210 and 212, and sense amplifier control lines 210a and 210b transmit the control signals which control the amplification ratio of the flip flop comprising NMOS transistors 214 and 216.

As described above, in the present embodiment, sense amplifier control lines 208a and 210a and digit line balance precharge signal line 202a are provided with respect to sense amplifier circuit 174a and sense amplifier control lines 208b and 210b and digit line balance precharge signal line 202b is provided with respect to sense amplifier circuit 174b, so that the sense amplifier circuit 174a belonging to the first segment and the sense amplifier circuit 174b belonging to the second segment are independently controlled. As described above, the reason for this is that it is necessary to conduct control such that the sense amplifier circuits belonging to the differing segments are not simultaneously connected to the data transfer bus line pair 176. Furthermore, with respect to other reasons, in particular when data is transferred from the auxiliary memory unit 102 to the main memory unit 101, it is necessary that the sense amplifier circuit belonging to the segment which is in a non transferring state amplify the signal which is stored in the memory cell within the main memory memory cell, and that the sense amplifier circuit belonging to the segment which in a transferring state amplify the data which is transferred by the data transfer bus line.

(2) Operation

Next, the operation of the semiconductor integrated circuit device in accordance with the second embodiment of the present invention having the structure described above will be explained.

The main memory unit power source level is represented by V1, the main memory unit increased voltage power source level is represented by V1', the intermediate potential level is represented by ½ V1, the precharge level of the data transfer bus line is represented by VP, the auxiliary memory unit power source level is represented by V2, and the ground level is represented by 0.

[Data Transfer from Main Memory Unit 101 to Auxiliary Memory Unit 102]

First, when the active command (ACT) is inputted into command decoder 132, then sense amplifier unit control circuit 302 sets the digit line balance precharge signal lines 202a and 202b to a low level. The reason that both the digit line balance precharge signal lines 202a and 202b are set to a low level is so that the signals of both memory cell 173a and memory cell 173b will be amplified. Here, as described hereinbelow, when transferring data, only one of the sense amplifier circuits 174a and 174b is connected to the data transfer bus line pair 176.

When the digit line balance precharge signal lines 202a and 202b are set to a low level, the digit line balance precharge circuit within the sense amplifier circuit belonging to the first segment enters a non-operational state. Next, a certain row in the main memory memory cell 110 provided within the main memory unit 101 is activated by main memory row decoder 112, and word line 172 is set to the main memory unit increased voltage power source level V1'.

When word line 172 attains a high level, the signal stored in memory cell 173a is inputted into the digit line balance precharge circuit via digit line pair 170a. Then, sense amplifier unit control circuit 302 sets sense amplifier control line 208a to the main memory unit power source level V1, and sets the level of sense amplifier control line 210a to the ground level 0.

When the level of the sense amplifier control line 208a is set to the main memory unit power source level V1 and the level of the sense amplifier control line 210b is set to the ground level 0, then a large difference in potential arises in the sense amplifier internal point pair 217, and the difference in potential in digit line pair 170 slowly increases.

When in this state the transfer command (PFC) is inputted, sense amplifier unit control circuit 302 sets the voltage level of the sense amplifier unit transfer switch signal 204a to the main memory unit power source level V1, NMOS transistors 218 and 220 enter an ON state, and the signal stored in the sense amplifier internal point pair 217 is outputted to the data transfer bus line pair 176. It should be noted here that the voltage level of the sense amplifier unit transfer switch signal line is set to the main memory power source level V1.

The reason for this is to prevent the problem described above wherein, when the main memory unit increased voltage power source is applied as the sense amplifier unit transfer switch signal when transferring data from the sense amplifier circuit 174 to the data transfer bus line pair 176, the data transfer bus line pair 176 is set lower than the high side junction level within the sense amplifier circuit 174, so that this is subtracted by the level of the data transfer bus line pair 176, the high side junction level within the sense amplifier circuit 174 decreases, and the ability to transfer data from sense amplifier circuit 274 to data transfer bus line pair 176 decreases.

In this way, the sense amplifier circuit belonging to the first segment is connected to the data transfer bus line pair 176, and the data transfer is conducted.

The sense amplifier control circuit 302 sets the voltage level of the sense amplifier unit transfer switch signal line 204a to the main memory power source level V1, and simultaneously, the data transfer bus line control circuit 140 sets the level of the data transfer bus line control signal line 190 to a lower level, and thus the data transfer bus line precharge circuit 152 is placed in a non-operational state.

The signal outputted from sense amplifier circuit 174a to data transfer bus line pair 176 is inputted into auxiliary memory memory cell 182.

Furthermore, the sense amplifier circuit 302 described above sets the voltage level of the sense amplifier unit transfer switch signal line 204a to the main memory power source level V1, and then, at a slight delay, the auxiliary memory unit control circuit 142 sets auxiliary memory memory cell row control line 252 to the ground level 0, thus placing the flip flop comprising PMOS transistors 256 and 258 in a non-operating state, and sets the auxiliary memory memory cell row decoder line 254 to the auxiliary memory unit power source level V2 and thus places the flip flop comprising NMOS transistors 260 and 262 in a non-operating state.

The auxiliary memory unit control circuit 142 sets the auxiliary memory memory cell row control line 252 to the ground level 0, and sets the auxiliary memory memory cell row control line 254 to the auxiliary memory unit power source level V2, and then, at a slight delay, sets the data transfer auxiliary memory row selecting line to the main memory unit increased voltage power source level V1', thus placing the connecting circuit comprising NMOS transistors 264a and 264b in an open state, and incorporating the signal in data transfer bus line pair 176 into memory cell 182. Here, the reason that the data transfer auxiliary memory row selecting line is set to the main memory unit increased voltage power source level V1' when incorporating data transferred from main memory unit 101 is so as to obtain, with respect to the level of the data transfer bus line, an appropriate level of voltage increase with respect to the gate electrodes of the NMOS transistors 264a and 264b which serve to incorporate data into the memory cell 182.

Furthermore, when the data are incorporated, the potential of the data transfer bus line 176 is slightly lower than the power source voltage of the main memory unit 101, so that it is necessary to place the transistors 256, 258, 260, and 262 within memory cell 182 in a completely OFF state and then conduct incorporation, and thereafter conduct amplification.

In the present embodiment, the potential of the auxiliary memory memory cell low control lines 252 and 254, which control the source voltages of the transistors 256, 258, 260, and 262 provided within memory cell 182, are set to, respectively, the ground potential 0 and the auxiliary memory unit power source level V2, and thereby, once a non-conducting state has been achieved, the signals in data transfer bus line pair 176 are incorporated. The data incorporated into memory cell 182 are stored by setting the level of auxiliary memory row control signal lines 252 and 254 to, respectively the auxiliary memory unit power source level V2, and the ground level 0.

The transfer operation is terminated by the means of the above operations. After the completion of transfer, the level of data transfer bus line control signal line 190 becomes the main memory unit increased voltage power source level V1', and the data transfer bus lines are precharged. Next, when the precharge command (PRE) is inputted, the word line 172 is set to a low level, the sense amplifier control lines 208 and 210 are set to the intermediate potential ½ V1, and the digit line balance precharge signal lines 202a and 202b are set to a high level. What is important to note here is that at the point at which the transfer operation has been completed, a non-transfer state has been achieved, and the data transfer bus line pair 176 is precharged to an intermediate potential which is lower than the power source voltage of the main memory unit; by setting the values in this manner, it is possible to ameliorate the level of the increase in potential in the data transfer auxiliary memory row selecting line.

Continuing, when data is transferred from main memory unit 101 to auxiliary memory unit 102, the sense amplifier unit control circuit 302 outputs a control signal to the sense amplifier circuit belonging to the second segment via the digit line balance precharge signal line 202b, the sense amplifier control line 208b and 210b, and the sense amplifier unit transfer switch signal line 204b, and by connecting the sense amplifier circuit belonging to the second segment to the data transfer bus line pair 176, data transfer is conducted by conducting operations identical to those described above.

[Data Transfer from Auxiliary Memory Unit 102 to Main Memory Unit 101]

Figure 16:
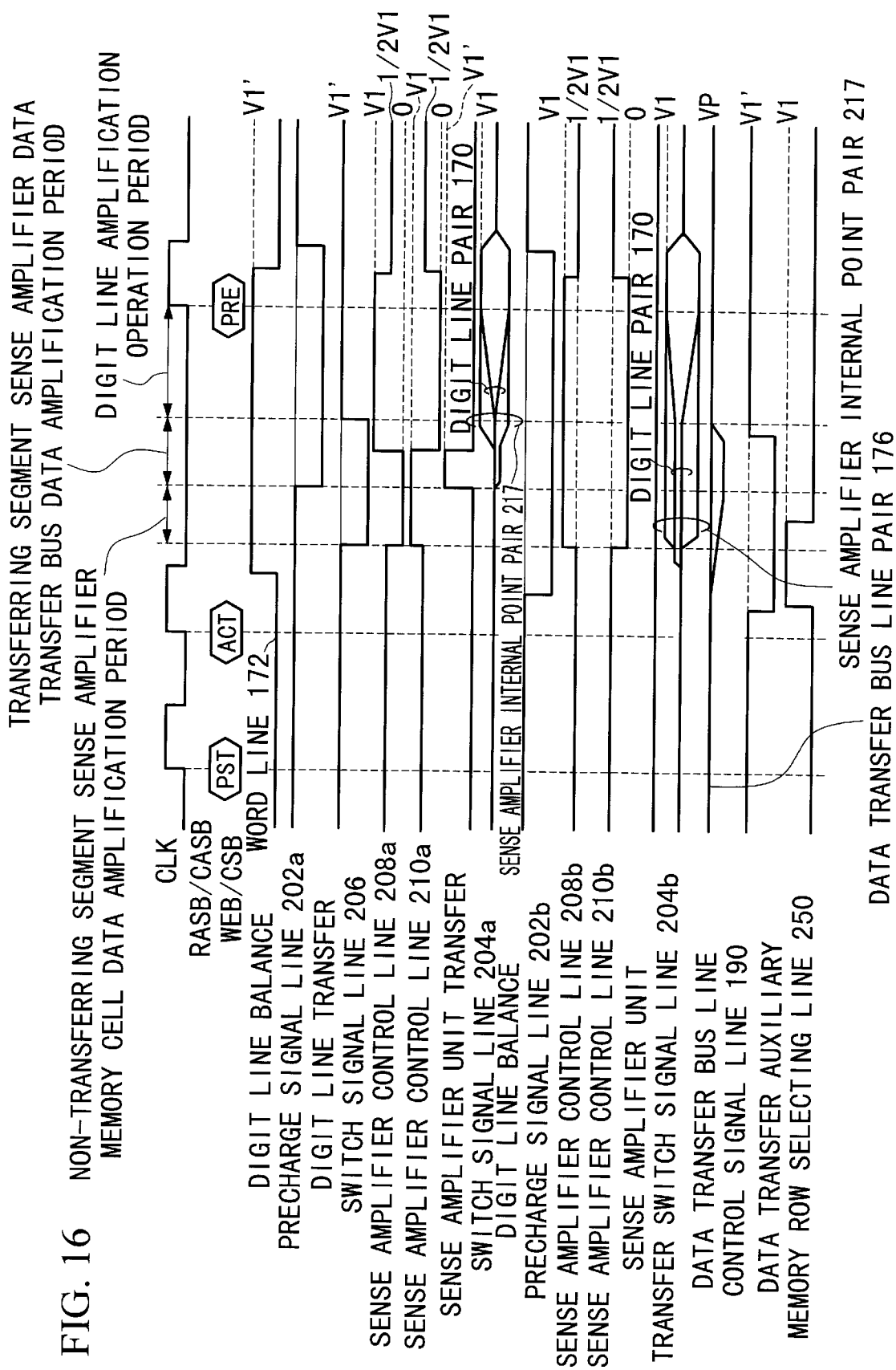
FIG. 16 is a timing chart showing operations during data transfer from auxiliary memory unit 102 to main memory unit 101 in a semiconductor integrated circuit device in accordance with a second embodiment of the present invention.
Figure 17:
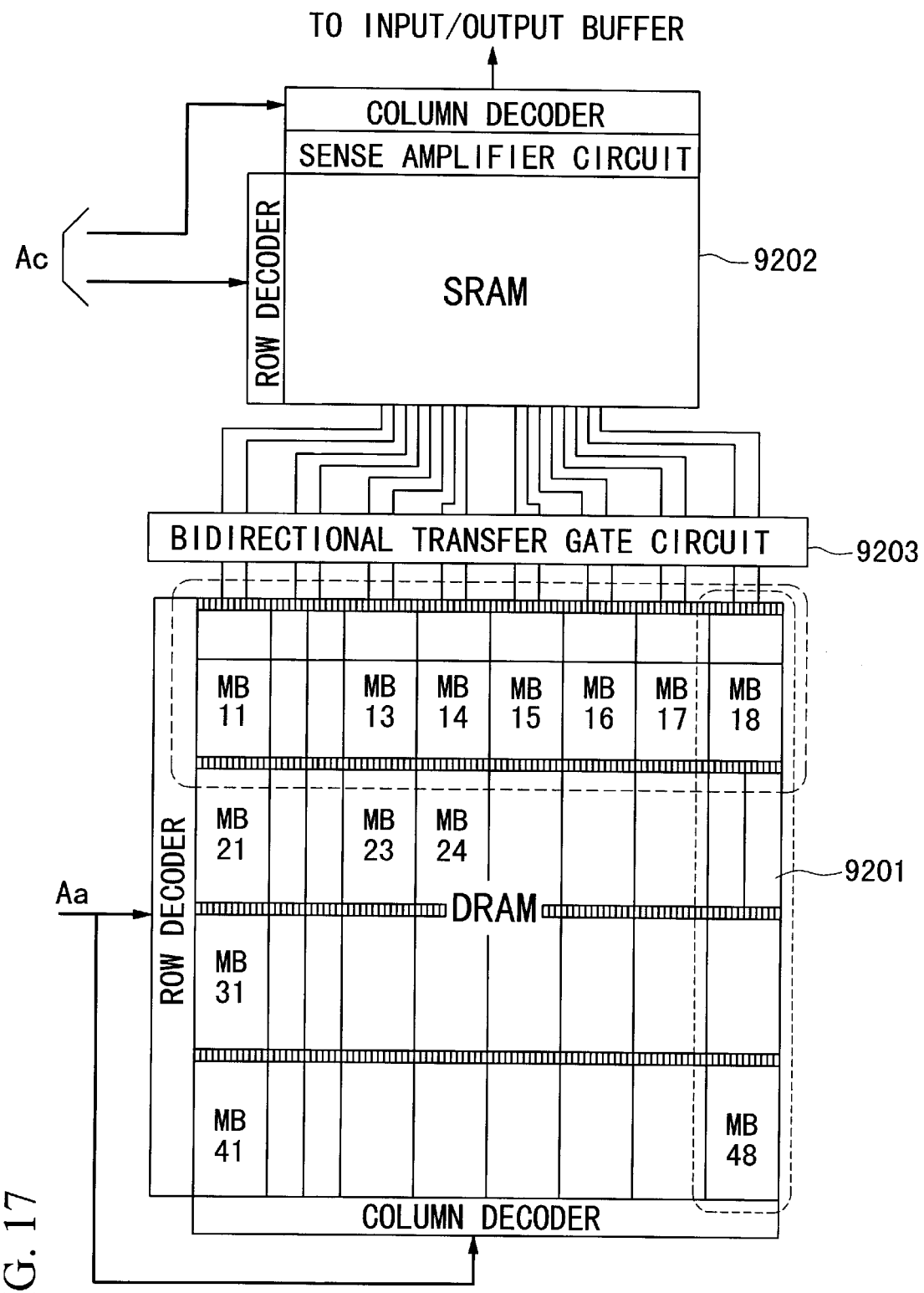
FIG. 17 shows in schematic form an example of the structure of a CDRAM memory array.
Figure 18:
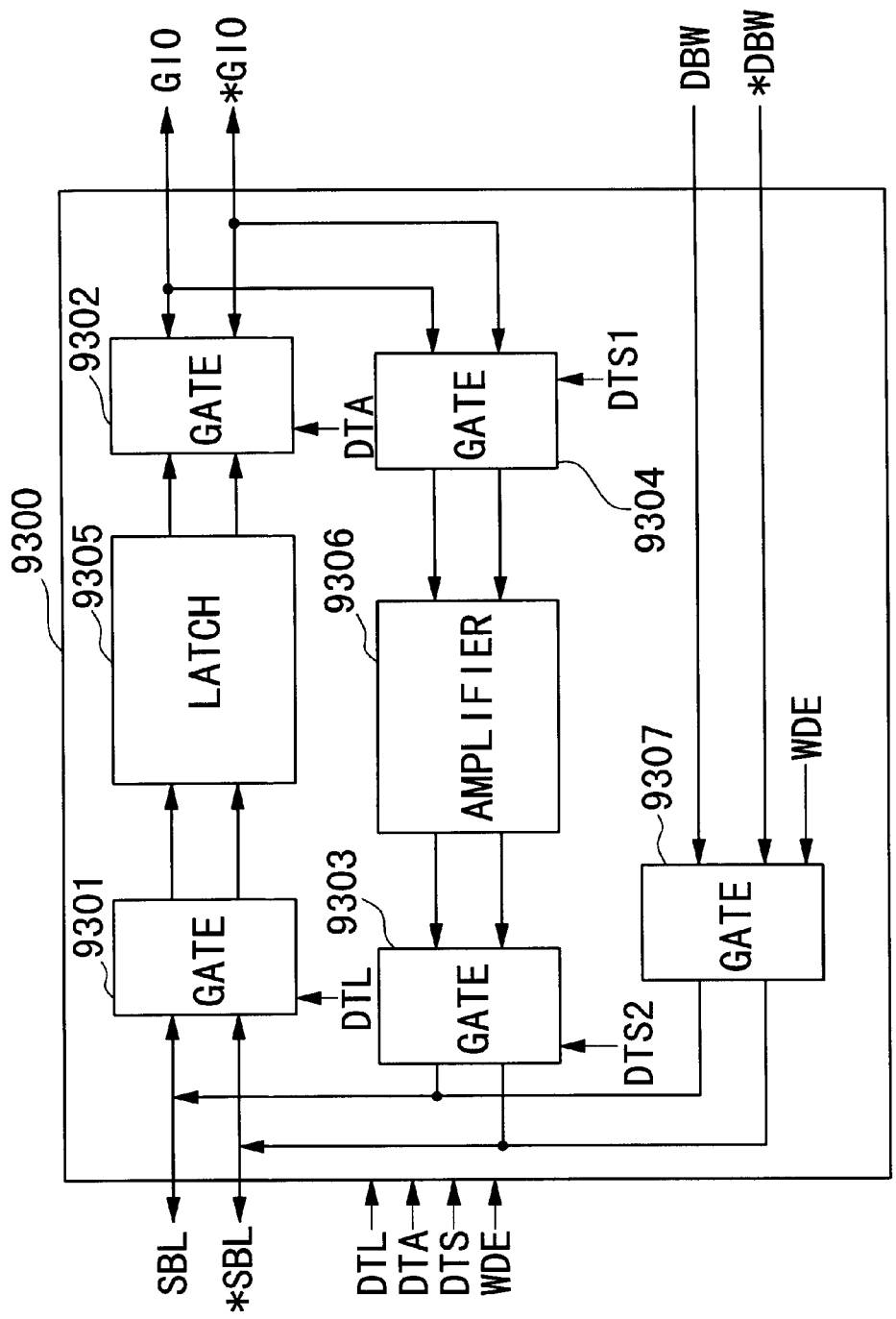
FIG. 18 shows the detailed structure of a bidirectional transfer gate circuit 9203.
Figure 19:
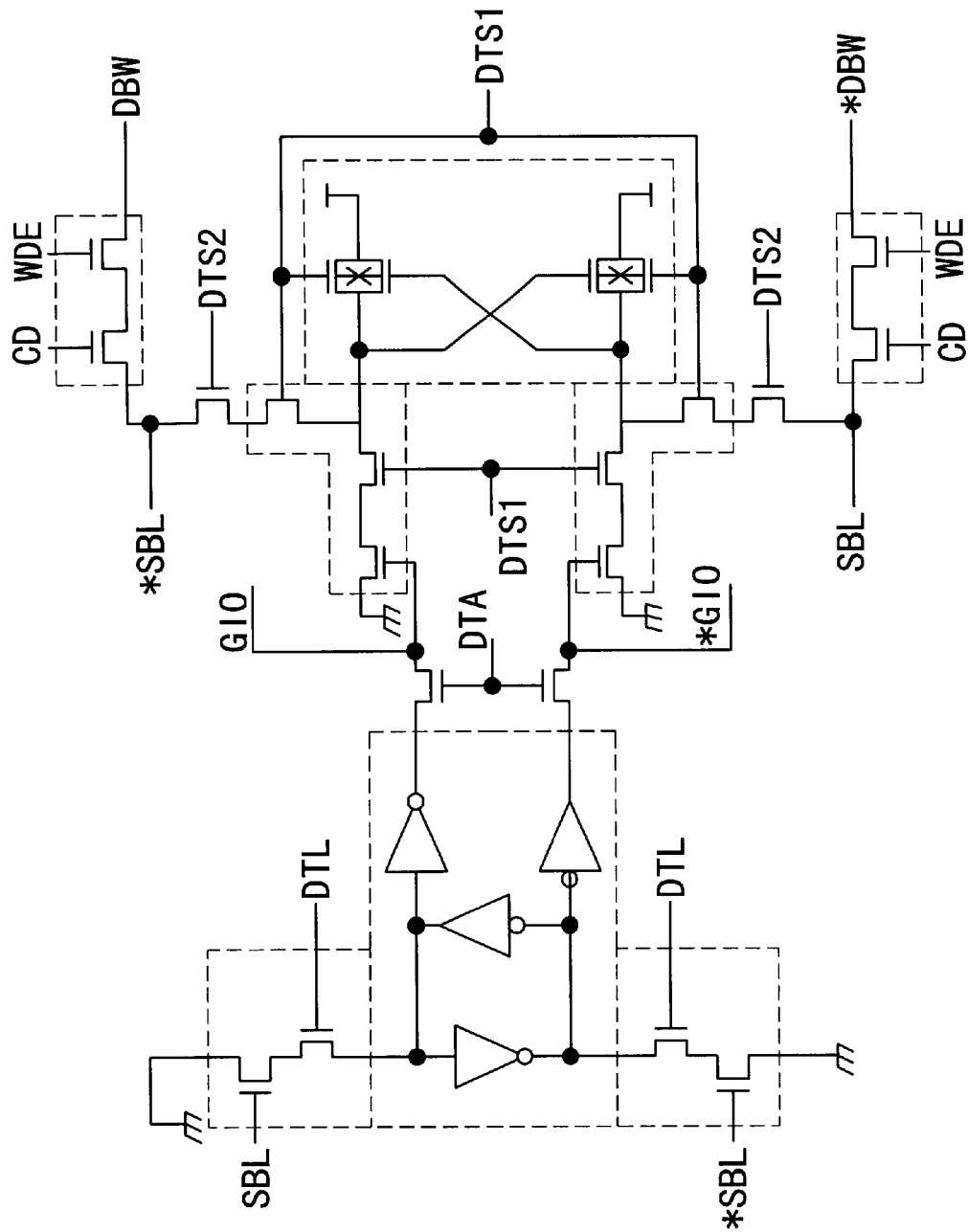
FIG. 19 shows the detailed structure of a bidirectional transfer gate circuit 9203.

FIG. 16 is a timing chart which shows the operation by which data transfer is conducted from the auxiliary memory unit 102 to the main memory unit 101 in a semiconductor integrated circuit device in accordance with a second embodiment of the present invention.

In FIG. 16, as in FIG. 9, the main memory unit power source level is indicated by V1, the main memory unit increased voltage power source level is indicated by V1', the intermediate potential level is indicated by ½ V1, the data transfer bus line precharge level is indicated by VP, the auxiliary memory unit power source level is indicated by V2, and the ground level is indicated by 0.

In FIG. 16, the signals which were transmitted on the signal lines depicted in FIG. 1 and FIGS. 14 and 15 are shown.

First, when the transfer command is inputted into command decoder 132 by the successive commands RST and ACT, the data transfer bus line control circuit 140 sets the level of data bus line control signal line 190 from the main memory unit increased voltage power source level V1' to a low level, and sets the precharge circuit 178 to a non-operational state. Next, the auxiliary memory unit control circuit 142 sets the data transfer auxiliary memory row selecting line 250 to the main memory power source level V1.

Here, the reason that the auxiliary memory unit control circuit 142 sets the data transfer auxiliary memory row selecting line 250 to the main memory power source level V1 is so as to prevent the possibility that the voltage level in data transfer bus line pair 176 is charged to a voltage which is higher than the main memory unit power source level when the main memory unit increased voltage power source level is applied to the data transfer auxiliary memory row selecting line 250, in the case in which data are transferred from the auxiliary memory memory cell 120 to the sense amplifier circuits 174 of main memory unit 101, because the power source voltage supplied to the auxiliary memory unit 102 is a higher voltage than the power source voltage of main memory unit 101, as a result of the requirement for higher operating speed.

When the data transfer auxiliary memory row selecting unit 250 is set to the main memory power source level V1, the NMOS transistors 264a and 264b which comprise the connecting circuit enter an ON state, and the signal stored in the flip flop circuits comprising PMOS transistors 256 and 258 and NMOS transistors 260 and 262 is outputted to the data transfer bus line pair 176.

Continuing, the sense amplifier unit control circuit 302 sets the level of the digit line balance precharge signal line 202b to a low level, and the digit line balance precharge circuit within the sense amplifier circuit 174b belonging to the second segment is placed in a non-operating state. On the other hand, the sense amplifier unit control circuit 302 maintains the level of the digit line balance precharge signal line 202a at a high level, thus maintaining a balance precharge. The reason for this is so that the signal of memory cell 173a is not amplified in sense amplifier circuit 174a within the first segment in the transfer state, and furthermore, so that unnecessary differences in potential are not created in the sense amplifier internal point pair as a result of noise from the sense amplifier circuit 174*b* belonging to the adjacent second segment which is in a non-transferring state. Next, the main memory row decoder 112 sets the level of the word line 172 to the main memory increased voltage power source level V1'.

When the settings described above are completed, the sense amplifier unit control circuit 302 sets the level of the digit line transfer switch signal line 206 to a low level, and breaks the electrical connection between the digit line pair 170*a* and the sense amplifier circuit 174*a* belonging to the first segment which is in a transfer state, and between the digit line pair 170*b* and the sense amplifier circuit 174*b* which belongs to the second segment. This is done so that the load of the sense amplifier circuit 174*a* as viewed from the data transfer bus line pair 176 is reduced by breaking the electrical connection between the digit line pair 170*a* and the sense amplifier circuit 174*a*, and thus achieving a shortening of the period of data incorporation.

Furthermore, sense amplifier control circuit 302 sets the level of the sense amplifier control line 208*a* from the intermediate potential ½ V1 to the ground level 0, and sets the level of the sense amplifier unit control line 210*a* from the intermediate potential ½ V1 to the main memory power source level V1.

Next, sense amplifier unit control circuit 302 sets the level of sense amplifier unit control line 208*b* from the intermediate potential ½ V1 to the main memory power source level V1, and sets the level of the sense amplifier unit control line 210*b* from the intermediate potential ½V1 to the ground level 0. The reason that the sense amplifier unit control circuit 302 sets the level of the sense amplifier control line 208*b* to the main memory power source level V1 and sets the level of the sense amplifier unit control line 210*b* to the ground level is that it is necessary to amplify the signal of memory cell 173*b*, since the second segment is in a non-transferring state.

In this state, the signal of memory cell 173*b* is amplified in the sense amplifier circuit 174*b* belonging to a segment which is in a non-transferring state, and furthermore, data from the memory cell 182 within the auxiliary memory unit 102 is incorporated into the sense amplifier circuit 174*a* belonging to a segment which is in a transferring state via data transfer bus line pair 176.

In this way, prior to conducting data transfer operations, the signal of the memory cell 173*b* is amplified in the sense amplifier circuit 174*b* within a segment which is in a non-transferring state; the reason for this is to prevent mistakes in operation resulting from noise from other circuitry, since the signal of memory cell 173*b* is extremely weak.

In other words, this is done so that noise generated during the transfer of data from auxiliary memory unit 102 to the sense amplifier circuit 174*a*, and the amplification thereof, does not affect the amplification operation of the signal of memory cell 173*b* of sense amplifier circuit 174*b* belonging to a segment which is in a non-transferring state.

While the sense amplifier circuit 174 belonging to the segment which is in a non transferring state conducts the amplification of the signal of memory cell 173*b*, the auxiliary memory unit control circuit 142 sets the level of the data transfer auxiliary memory row selecting line 250 to a low level, and breaks the electrical connection between the memory cell 182 and the data transfer bus line pair 176 within auxiliary memory unit 102. Next, when the signal of the memory cell 173*b* is amplified to a certain extent by the sense amplifier circuit 174*b* belonging to the second segment which is in a non-transferring state, the sense amplifier unit control circuit 302 sets the level of the digit line balance precharge signal line 202*a* to a low level and places the digit line balance precharge circuit within the sense amplifier circuit belonging to the first segment in a non-operating state. Furthermore, the sense amplifier unit control circuit 302 sets the level of the sense amplifier unit transfer switch signal line 204*a* to the main memory unit increased voltage power source level V1', placing the connecting circuit NMOS transistors 218 and 220 in an open state, and incorporating data from data transfer bus line pair 176 into the sense amplifier circuit 174*a*.

Here, the reason that the level of the sense amplifier unit transfer switch signal line 204 is set to the main memory unit increased voltage power source level V1' is that it is necessary, with respect to the level of the data transfer bus line, to apply an appropriate level of voltage increase with respect to the gate electrodes of the NMOS transistors 218 and 220 which serve to incorporate data into the sense amplifier circuit 174.

In the present embodiment, the potential of the sense amplifier circuit lines 208 and 210, which control the source voltages of transistors 210, 212, 214, and 216 which are provided within the sense amplifier circuit 174, is controlled, and these are placed in a non-conducting state, and then the signal in data transfer bus line pair 176 is incorporated.

Furthermore, at the point in time at which the data are incorporated from the data transfer bus line pair 176, the level of the digit line transfer switch signal line 206 becomes a low level and the electrical connection between the sense amplifier circuit 174*a* and the digit line pair 170*a* is broken, so that data incorporation can be conducted in a short period of time.

When data incorporation is terminated, sense amplifier unit control circuit 302 sets the level of the sense amplifier unit transfer switch signal line 204*a* to a low level, and the electrical connection between the sense amplifier circuit 174*a* belonging to the first segment which is in a transfer state and the data transfer bus line pair 176 is broken. Furthermore, the sense amplifier unit control circuit 302 sets the level of the sense amplifier control line 208*a* to the main memory power source level V1, and sets the level of the sense amplifier control line 210*a* to the ground level 0. Next, the data transfer bus line control circuit 140 sets the level of the data transfer bus line control circuit line 190 to the main memory unit increased voltage power source level V1'. The transfer operation is completed by means of the above operations.

In this state the sense amplifier unit control circuit 302 sets the level of the digit line transfer switch signal line 206 to a high level, and breaks the electrical connection between the sense amplifier circuit 174*a* belonging to the first segment and the digit line pair 170*a*, as well as between the sense amplifier circuit 174*b* belonging to the second segment and the digit line pair 170*b*. The signal incorporated into the sense amplifier circuit 174*a* is amplified by the flip flop comprising PMOS transistors 210 and 212 and by the flip flop comprising NMOS transistors 214 and 216, and as shown in FIG. 16, the difference in potential in the sense amplifier internal point pair 217 becomes large, and the difference in potential of the digit line pair 170*a* slowly increases.

The data of the digit line pair 170*a* are incorporated into the main memory memory cell 110. Next, when the precharge command (PRE) is inputted, the main memory row decoder 112 sets the word line 172 to a low level, and a sense amplifier unit control circuit 302 sets the level of the sense amplifier control lines 208a and 208b and the level of the sense amplifier control lines 210a and 210b to the intermediate potential level ½ V1.

The sense amplifier unit control circuit 302 sets the digit line balance precharge signal lines 202a and 202b to a high level, thus setting the digit line balance precharge circuit to an operational state, and completing the transfer operation.

What is claimed is:

1. A semiconductor integrated circuit device which is provided with a main memory unit and an auxiliary memory unit and which is capable of conducting bidirectional data transfer via data transfer bus lines provided between said main memory unit and said auxiliary memory unit, wherein are provided:

sense amplifier circuits provided within said main memory unit, a sense amplifier unit control circuit for controlling said sense amplifier circuits, and switch means for electrically connecting said sense amplifier circuits and main memory unit memory cells within said main memory unit;

and wherein, after data transferred from said main memory unit to said auxiliary memory unit are incorporated into said sense amplifier circuits, said sense amplifier unit control circuit controls said switch means and electrically disconnects said sense amplifier circuits from said main memory unit memory cells, and data are transferred from said main memory unit to said auxiliary memory unit in this disconnected state.

2. The semiconductor integrated circuit device in accordance with claim 1, wherein said sense amplifier unit control circuit controls said switch means and electrically disconnects said sense amplifier circuits from said main memory unit memory cells, in parallel with amplification of said data incorporated into said sense amplifier circuit, and when, in the state in which said sense amplifier circuits and said main memory unit memory cells are electrically disconnected, a transfer initiation command for initiating data transfer from said main memory unit to said auxiliary memory unit is inputted, data are transferred.

3. The semiconductor integrated circuit device in accordance with claim 1, wherein said sense amplifier unit control circuit conducts amplification of said data incorporated into said sense amplifier circuits, and when a transfer initiation command for initiating data from main memory unit to said auxiliary memory unit is inputted, electrically disconnects said sense amplifier circuits from said main memory unit memory cells, and in the state in which said sense amplifier circuits and said main memory unit memory cells are electrically disconnected, said data are transferred.

4. The semiconductor integrated circuit in accordance with claim 1, wherein an operation initiation command for activating said main memory unit and a transfer operation initiation command for initiating transfer of data from said main memory unit to said auxiliary memory unit are inputted at the same timing.

5. The semiconductor integrated circuit device in accordance with claim 1, wherein said sense amplifier unit control circuit controls said switch means at the termination of transfer and electrically connects said sense amplifier circuits and said main memory unit memory cells.

6. The semiconductor integrated circuit device in accordance with claim 5, wherein said auxiliary memory unit is divided into a plurality of auxiliary memory unit memory cell rows, and said sense amplifier unit control circuit controls said switch means at the termination of transfer to said plurality of auxiliary memory unit memory cells and electrically connects said sense amplifier circuits and said main memory unit memory cells.

* * * * *